US006750625B2

(12) United States Patent
Binnard et al.

(10) Patent No.: US 6,750,625 B2
(45) Date of Patent: Jun. 15, 2004

(54) WAFER STAGE WITH MAGNETIC BEARINGS

(75) Inventors: Michael Binnard, Belmont, CA (US); Kazuya Ono, Kumagaya (JP); Andrew J. Hazelton, San Carlos, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/929,025

(22) Filed: Aug. 15, 2001

(65) Prior Publication Data

US 2003/0034695 A1 Feb. 20, 2003

(51) Int. Cl.[7] .............................................. G05B 11/18
(52) U.S. Cl. .................... 318/592; 318/649; 318/671; 318/687; 318/574; 318/568.17; 318/568.19; 350/467.1; 350/492.2; 355/55
(58) Field of Search ................. 318/649, 671, 318/687, 592, 574, 568.17, 568.19, 135; 250/467.1, 492.2; 355/55; 700/280; 267/136; 73/662

(56) References Cited

U.S. PATENT DOCUMENTS

| 3,935,486 A |   | 1/1976  | Nagashima ............... 310/12    |
|-------------|---|---------|------------------------------------|
| 4,017,001 A |   | 4/1977  | Barthalon et al. ......... 221/5   |
| 4,952,858 A |   | 8/1990  | Galburt .................. 318/647 |
| 5,157,296 A |   | 10/1992 | Trumper ................. 310/90.5 |
| 5,294,854 A |   | 3/1994  | Trumper ................. 310/90.5 |
| 5,528,118 A | * | 6/1996  | Lee ...................... 318/568.17 |
| 5,623,853 A |   | 4/1997  | Novak et al. ............ 74/490.09 |
| 5,780,943 A | * | 7/1998  | Ono ...................... 310/12    |
| 5,991,005 A |   | 11/1999 | Horikawa et al. ......... 355/53   |
| 6,036,162 A | * | 3/2000  | Hayashi .................. 248/550 |
| 6,255,796 B1 | * | 7/2001  | Ebihara et al. ............ 318/649 |
| 6,281,655 B1 | * | 8/2001  | Poon et al. ............... 318/649 |
| 6,337,484 B1 | * | 1/2002  | Loopstra et al. ......... 250/442.11 |

FOREIGN PATENT DOCUMENTS

| EP | 0 973 067  | 1/2000  |
|----|------------|---------|
| EP | 1 160 628  | 12/2001 |
| GB | 1424413    | 2/1976  |

\* cited by examiner

*Primary Examiner*—Rita Leykin
(74) *Attorney, Agent, or Firm*—Finnegan, Henderson, Farabow, Garrett & Dunner LLP

(57) ABSTRACT

A high accuracy stage supported in six degrees of freedom by electromagnetic bearings. Movements in the horizontal plane of the stage are controlled by variable reluctance actuators which are mounted between the high accuracy stage and a coarse stage so as not to distort the high accuracy stage during movements thereof. The high accuracy stage is supported in three vertical degrees of freedom by electromagnetic actuators disposed between the coarse stage and the high accuracy stage and aided by a supplemental vertical support disposed adjacent to the actuators. Preferably, the high accuracy stage is suspended from a bar supported by the supplemental vertical support, which is preferably air bellows.

116 Claims, 11 Drawing Sheets

WAFER STAGE WITH MAGNETIC BEARINGS

This application repeats a substantial portion of prior International Application No. PCT/US00/10831 filed Apr. 21, 2000, and adds and claims additional disclosure not presented in the prior application. Since this application names an inventor named in the prior application, it may constitute a continuation-in-part of the prior application.

TECHNICAL FIELD

This invention relates to alignment and isolation apparatus and methods for use particularly in microlithography, among other applications. More particularly, this invention is directed to an apparatus which efficiently, electromagnetically supports a stage for aligning a stage in a microlithography machine.

BACKGROUND ART

The need for precise positioning of an object is required in many fields of application, including applications in semiconductor manufacturing such as microlithography. As microprocessors become faster and more powerful, an ever increasing number of transistors are required to be positioned on a semiconductor chip. This necessitates closer placement of the transistors and circuits interconnecting them, which in turn requires an ever increasing accuracy in the methods for laying down the circuits on the chip. Thus, there is a need for more precise positioning and maintaining of position, of a substrate during microlithography.

Various systems have been designed to attempt to improve fine positioning and movement control of a workpiece. British Patent Specification 1,424,413, assigned to Handotai Kenkyo Shinkokai describes several stages that are supported by flexures and actuated using electromagnetic force actuators. U.S. Pat. No. 3,935,486, invented by Nagashima describes a stage that is controlled using electromagnetic force actuators. In this case, the stage is supported on flexural bearings in 6 degrees of freedom (DOF) and the actuating portions are used to adjust the position of the stage. Both of these designs utilize flexural bearings to constrain the motion of the stages in 6 DOF. The electromagnetic actuator devices only provide force; they are not used to control all directions of motion of the stage.

Ideally, the bearings for a stage should have infinite stiffness in the directions for which position of the stage is to remain fixed, and zero stiffness along the directions in which the stage is to be moved, to maximize precision and efficiency. Flexural bearings fall far short of the ideal and generally have a stiffness ratio (stiffness in directions to be fixed to stiffness in directions to be moved) of only about 100:1 and possibly up to about 1000:1 but the price of the latter is likely prohibitive in practice. Moreover, a much greater stiffness ratio is desirable.

U.S. Pat. No. 4,952,858 invented by Galburt describes a wafer fine stage that is supported and positioned in 6 DOF by electromagnetic voice coil motors. The motion of the wafer fine stage is entirely constrained using voice coil motors, and this design does not utilize any flexural bearings. Voice coil motors, however, require relatively large amounts of power to generate a given amount of force. The high power requirements of voice coil motors can generate sufficient heat to change the index of refraction of the environment sufficiently to induce error in an interferometer system. Additionally, heat generation can cause expansion of the stage leading to further errors in alignment and control.

Further, U.S. Pat. No. 4,952,858 discloses the use of permanent magnets to counterbalance the weight of the fine stage. This counterbalance force is a nonlinear function of stage position, and is thus quite difficult to control accurately.

U.S. Pat. Nos. 5,157,296 and 5,294,854, invented by Trumper describe a wafer fine stage bearing system. This system includes electromagnetic actuator devices, which act as bearings in 6 DOF. These patents describe control means for the bearings and apparatus for counterbalancing the weight of the stage using either opposed permanent magnets or a heavy oil in which the stage floats. U.S. Pat. Nos. 5,157,296 and 5,294,854 also do not utilize flexural bearings. The electromagnetic actuator devices in the Trumper patents are arranged in pairs, on opposite sides of the stage, in order to provide stable control. Thus, all forces applied by the electromagnetic pairs are transmitted through the stage, which can result in deformation of the stage.

The counterbalance forces in the Trumper patents may be provided by permanent magnets or by floating the stage in oil. As noted above with regard to the Galburt patent, utilization of permanent magnets results in a nonlinear force curve and corresponding control problems. With regard to floating the stage in oil, oil presents significant problems for a clean room environment typically used for semiconductor processing.

U.S. Pat. No. 5,528,118, invented by Lee, describes a guideless stage for aligning a wafer in a microlithography system, and a reaction frame which isolates both external vibrations as well as vibrations caused by reaction forces from an object stage.

U.S. Pat. No. 5,623,853, invented by Novak, et al., describes a wafer coarse and fine stage for a lithography machine. The coarse stage is a stacked arrangement of linear motor-driven air bearing slides. The fine stage is driven in 3 DOF using voice coil motors. The remaining DOF of the fine stage are constrained using flexural bearings. The use of flexural bearings for the 3 planar DOF limits the servo bandwidth of the stage because the flexural bearings have a limited stiffness in the plane. In addition, the finite stiffness of the flexural bearings out of the plane, distorts the out of plane motion of the stage.

SUMMARY OF THE INVENTION

In accordance with principles of the invention a stage is provided which has a main surface positionally controllable in at least one degree of freedom. At least one pair of electromagnetic actuator devices couples the stage to a supporting stage for controlling movement of the stage in at least one degree of freedom. Both actuating portions of each pair of electromagnetic actuator devices are mounted adjacent to a single side of the stage so as not to distort the stage during controlling movements thereof.

Both of the actuating portions of each pair are mounted on the supporting stage in close opposition to one another, and a pair of corresponding targets are mounted on the stage adjacent one another and within a predefined gap defined by the pair of mounted electromagnetic actuator devices. Preferably, the stage is magnetically coupled, born and positionally controlled in three degrees of freedom by three pairs of electromagnetic actuator devices which electromagnetically couple the stage to the support stage. Two of the pairs are preferably aligned substantially parallel to a first direction, and the third pair is aligned in a second direction substantially perpendicular to the first direction. The first and second directions are substantially within the plane of the main surface of the stage.

A pair of corresponding targets are peripherally mounted on the stage for interaction with each electromagnetic pair mounted on the supporting stage. The pairs of electromagnetic actuator devices preferably comprise variable reluctance actuating portions which provide a very favorable force to surface area capability compared to other types of electromagnetic actuator devices, resulting in less heat generation. The three pairs of electromagnetic actuator devices interconnecting the stage and the supporting stage are actuable to control the stage in three degrees of freedom.

Three additional electromagnetic actuator devices are mounted between the stage and the supporting stage, which are actuable to control the stage in three additional degrees of freedom. The additional electromagnetic actuator devices preferably comprise voice coil motors, since the requirements for control in the three additional degrees of freedom are less stringent than those required of the electromagnetic pairs. Each of the three additional electromagnetic actuator devices preferably comprises one pair of electromagnetic actuator devices each comprising an actuating portion of variable reluctance and a corresponding target portion, when heat generation from the electromagnetic actuator device is critical to the system in which the stage is employed. The additional electromagnetic actuator device may be accompanied by a supplemental vertical support disposed at the same location as the additional electromagnetic actuator device so as not to cause any undesirable distortion to the stage. The supplemental vertical supports preferably comprise air bellows but may also be air cylinders or the like.

In use, the stage is levitated above the support stage by at least one non-contact vertical support member which is preferably three non-contact vertical support members for controlling the position of said stage in three vertical degrees of freedom. The non-contact vertical support members are preferably electromagnetic actuator devices, most preferably voice coil motors.

The targets are preferably mounted peripherally of the main surface of the stage, on target mounts which may be U-shaped, or the like, webs of material extending from the stage. Pairs of targets are mounted on each of the target mounts such that only a resultant force from actuation of the pair of corresponding electromagnetic actuator devices is transferred to the stage through each target mount.

Further disclosed is a lithography system incorporating the high accuracy stage according to principles of the invention. The lithography system includes an illumination system mounted on a frame, a supporting stage mounted on the frame which is substantially aligned with the illumination system, a stage having a main surface positionally controllable in at least one degree of freedom, and at least one pair of electromagnetic actuator devices coupling the stage to the supporting stage for control in at least one of the degrees of freedom. Both actuating portions of the pair of electromagnetic actuator devices are mounted adjacent a single side of the stage.

The lithography system farther includes a mask pattern positioned between the illumination system and the stage, a reticle supporting the mask, and optical system positioned between the reticle and the stage. The stage is preferably positionally controllable in at least three degrees of freedom by three pairs of electromagnetic actuator devices.

According to another aspect of the invention, there is provided a stage that is controllable in the vertical direction by an electromagnetic actuator device, and supported by a supplemental vertical support disposed underneath the stage at the same location as the electromagnetic actuator device. This configuration prevents distortion of the stage due to excessive vertical supplemental force. Preferably, the electromagnetic actuator device comprises three pairs of electromagnetic actuator devices each comprising an actuating portion of variable reluctance and a corresponding target portion for control in three vertical degrees of freedom. Each pair is accompanied by the supplemental vertical support. The stage is suspended from a bar that is supported by the supplemental vertical support using a wire running through a hole formed in the actuating portion and connecting the target portion mounted on the stage and the bar. This configuration allows the target portion to make small horizontal and rotational motions without affecting the position of the bar supported by laterally stiff supplemental vertical support.

These and other feature are more fully described in the detailed examples which follow.

DETAILED DESCRIPTION

Figure 1:
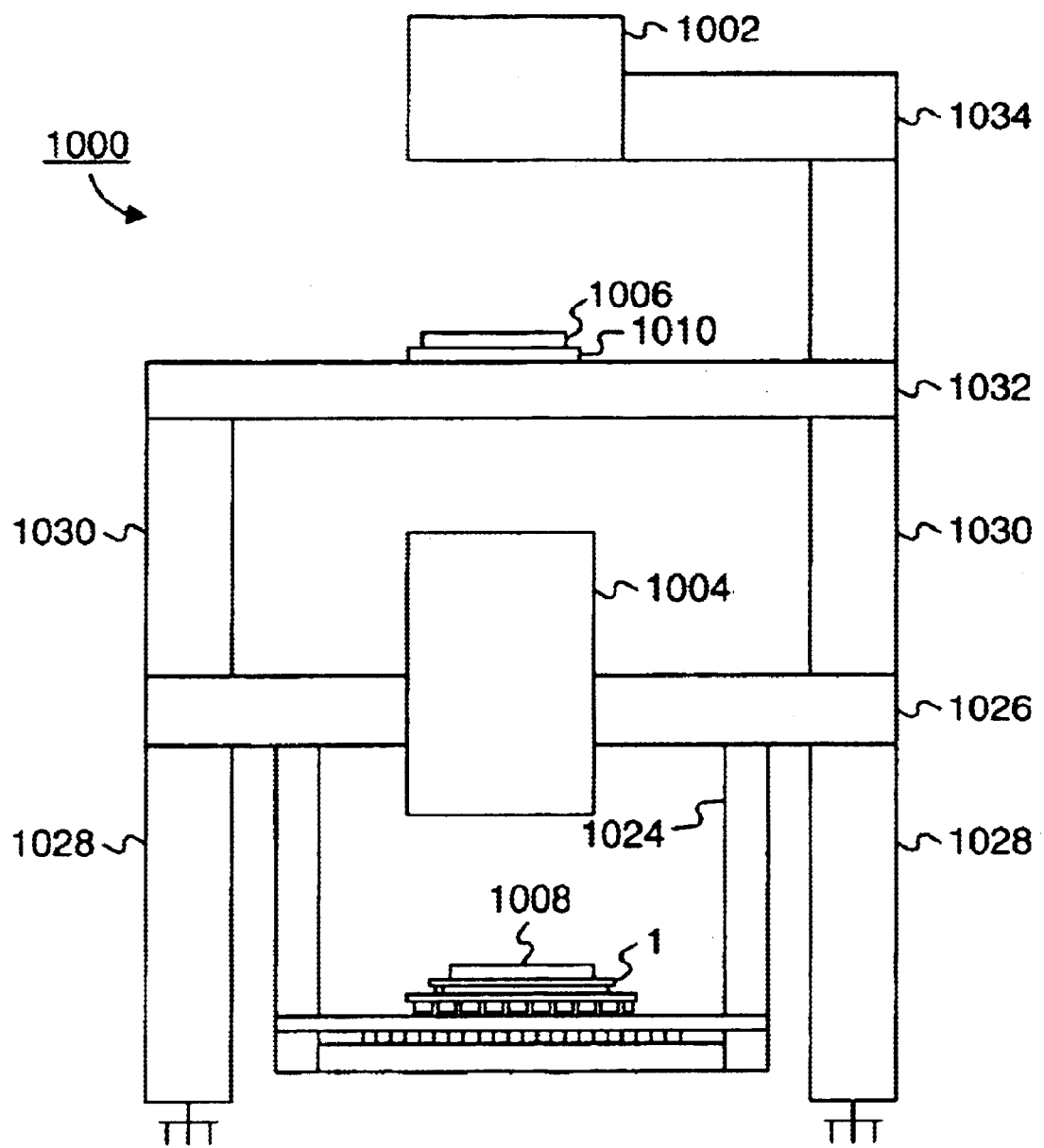
FIG. 1 is a schematic view illustrating a photolithographic instrument incorporating a wafer positioning stage in accordance with principles of the invention.

A brief description of a photolithographic instrument will be given here as background for a preferred use of the precision control stage according to principles of the invention. FIG. 1 is a schematic view illustrating a photolithographic instrument 1000 incorporating a wafer positioning stage driven by a linear motor coil array or planar motor coil array in accordance with principles of the invention. Photolithographic instrument 1000 generally comprises an illumination system 1002 and at least one linear or planar motor for wafer support and positioning. Illumination system 1002 projects radiant energy (e.g. light) through a mask pattern (e.g., a circuit pattern for a semiconductor device) on a reticle (mask) 1006 that is supported by and scanned using a reticle stage (mask stage) 1010. Reticle stage 1010 is supported by a frame 1032. The radiant energy is focused through a projection optical system (lens system) 1004 supported on a frame 1026, which is in turn anchored to the ground through a support 1028. Optical system 1004 is also connected to illumination system 1002 through frames 1026, 1030, 1032, and 1034. The radiant energy exposes the mask pattern onto a layer of photoresist on a wafer 1008.

Figure 2:
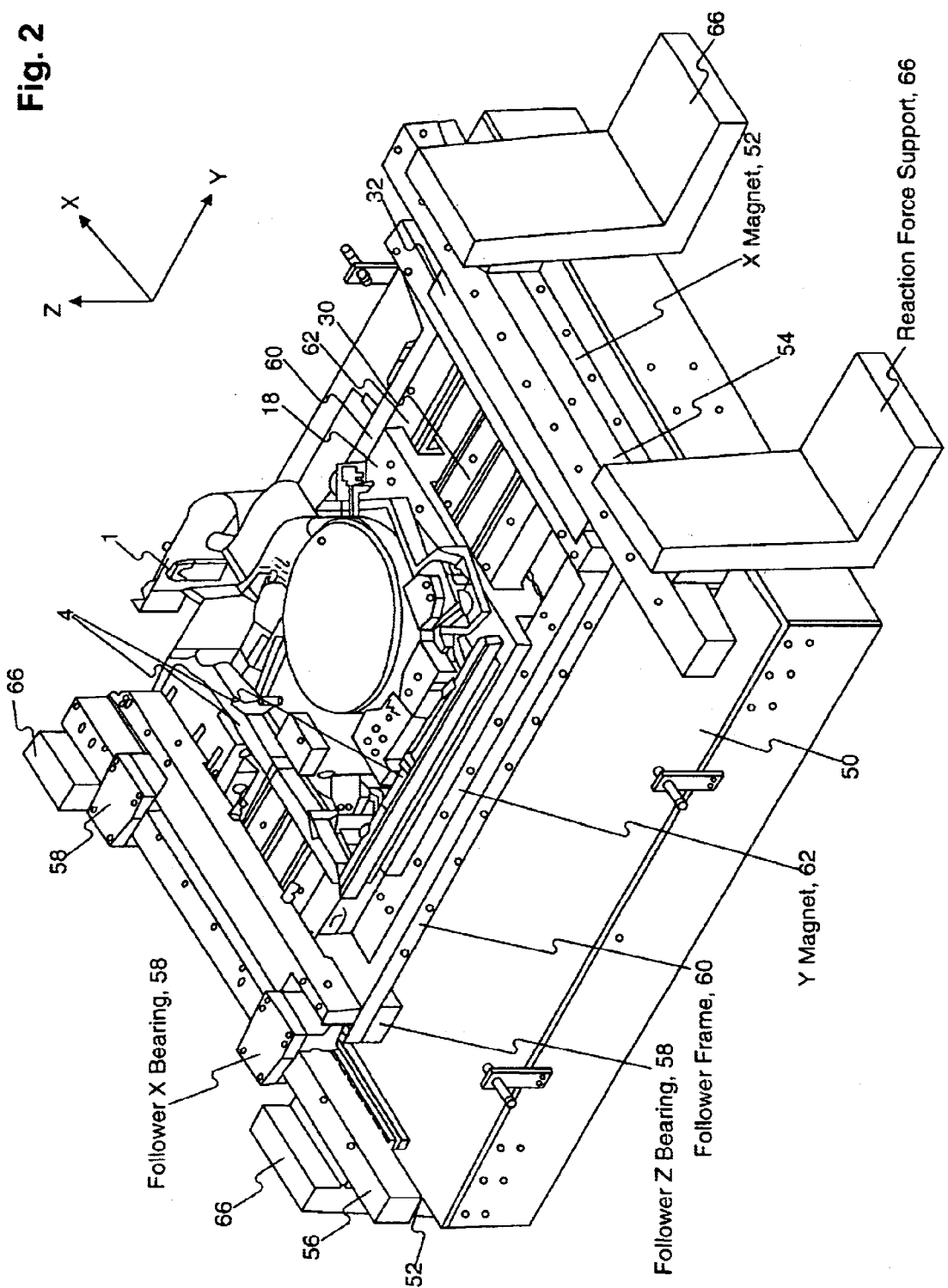
FIG. 2 is a perspective view of a stage system according to principles of the invention.

Wafer (object) 1008 is supported by and scanned using a fine wafer stage 1. The fine stage 1 is limited in travel to about 400 microns total stroke in each of the X and Y directions. The fine stage 1 is in turn supported by a lower stage (supporting stage) 18 (FIGS. 2–5). The lower stage 18 has a much longer stroke and is used for coarse positioning. For example, the lower stage 18 is substantially aligned with the optical system 1004. As shown in FIG. 2, the lower stage translates in the Y direction along a beam 30, by pushing on a follower frame 60. The follower frame 60 and the beam 30 move together in the X direction along X beam guide 54 and X follower guide 56. The entire assembly is guided in the Z direction by a base 50. The base 50 provides a smooth surface for the Z bearings, which are preferably air bearings, to ride upon. The base 50 is preferably formed of granite or other very planar and very dimensionally stable material. Thus, the Z bearings guide movements of the entire assembly to remain constant in the Z direction (X-Y plane).

The beam 30 runs through the center of the lower stage 18 (FIG. 3), and has a flat, smooth and preferably polished guide surface 31 that guides the lower stage as it moves in the Y direction. Air bearings are preferred for guiding the lower stage 18 along the guide surface 31 to permit low friction movement of the lower stage 18 along the beam 30. Although not shown, at least one air bearing is preferably attached to the inside of the lower stage 18 opposing the guide surface 31. Z air bearings 38 are attached to the base of the lower stage 18 to guide the stage motion in the plane. Electromagnetic motor coils 34 are provided at opposite ends of the beam 30. X magnets 52 (FIG. 2) are provided to interact with motor coils 34 to provide the driving force for the beam 30 and follower frame 60 in the X direction. Thus, linear motors are preferred as shown by the motor coils and magnets, but other alternative drives could be employed, although not as preferred, such as screw drives, rotary motors or other planar force motors, such as those described in copending U.S. patent application Ser. No. 09/192,637, filed on Nov. 16, 1998, and titled "A Platform positionable in at Least Three Degrees of Freedom by Interaction with Coils", for example. application Ser. No. 09/192,637 is hereby incorporated by reference in its entirety by specific reference thereto. Examples of photolithographic instruments that may incorporate a linear or planar motor of the invention are described in Nakasuji, U.S. Pat. No. 5,773,837, Nishi, U.S. Pat. No. 5,715,037, and Lee et al., U.S. Pat. No. 5,528,118, all of which are incorporated herein by reference in their entireties.

Figure 3:
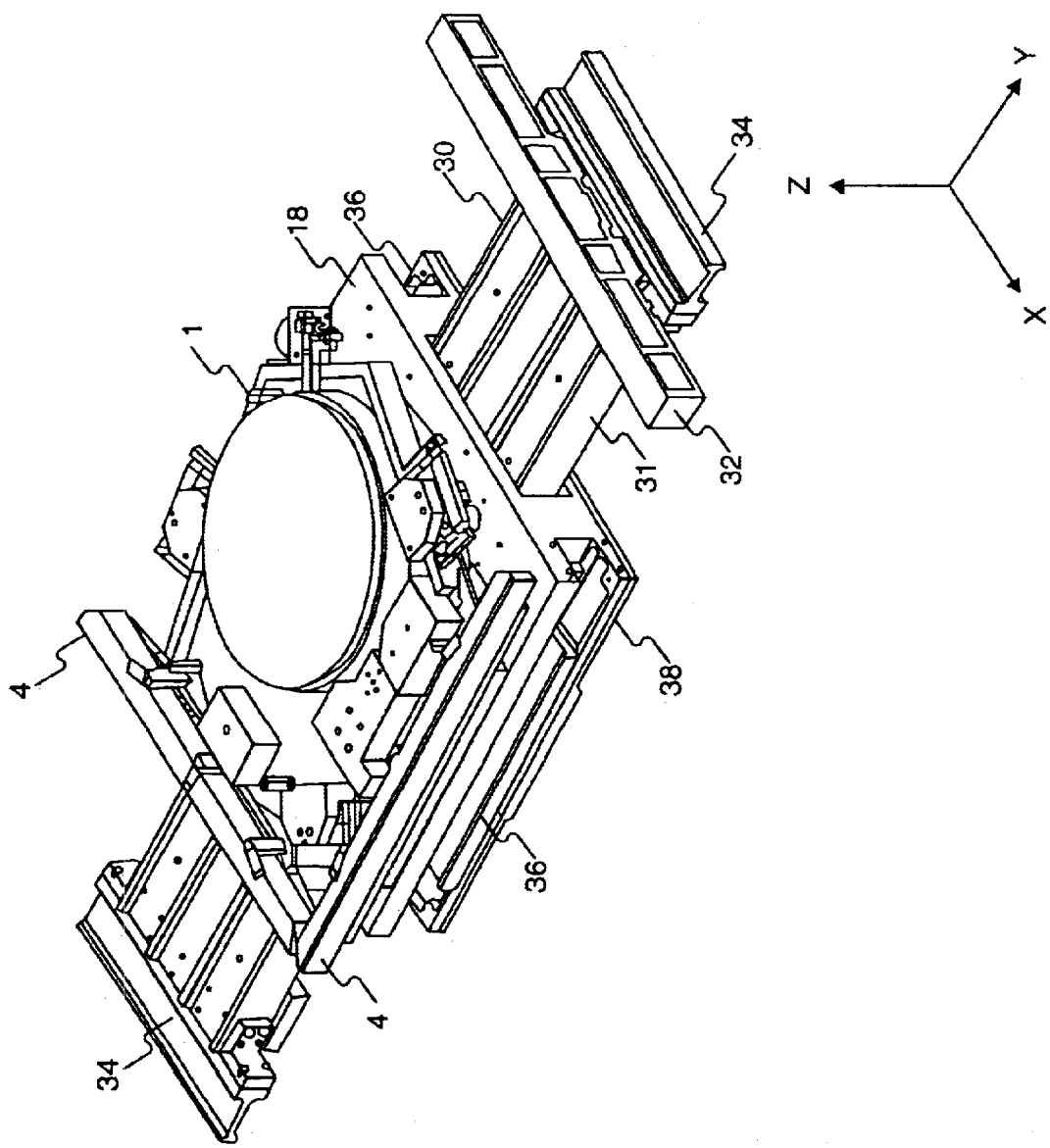
FIG. 3 is a perspective view of an upper portion of the stage system shown in FIG. 2, emphasizing the finely controlled stage.

An X beam guide 54 and an X beam or follower guide 56 are aligned above respective X magnets 52, as shown in FIG. 2. A linear bearing 32, which is preferably a vacuum preloaded air bearing, is provided adjacent an X motor coil 34 (FIG. 3). Upon insertion of the X motor coils 34 into the slots provided in the X magnets therefor, the linear bearing 32 closely approximates the guide surface of X beam guide 54 where the guide surface is provided with a very smooth surface against which the air bearing rides for guidance of the beam 30 in the X direction. The follower frame 60 is guided in the X direction via the attachment to the X follower guide 56 through X follower bearings 58, which are also preferably air bearings. Follower Z bearing 64, also preferably an air bearing, rides along the base 50 and supports the follower frame 60 in the Z direction. The beam 30 is actuated in the X direction through X motor coils 34. The lower stage 18 being mounted on the beam 30 follows the motion. The beam 30 does not move in the Y direction. However, the invention can also be configured with the beam 30 moving in the Y direction. When the construction has the beam 30 moving in the Y direction, there is a possibility that yawing will occur. The output from the linear motors located at both ends of the beam 30 can be suitably distributed to correct for yawing.

Y motor coils 36 are provided on opposite sides of the lower stage 18 (FIG. 3) for insertion within the slots provided in Y magnets 62 which are mounted to the follower frame 60 parallel to the Y axis. Actuation of the Y motor coils 36 motivates the coils 36 within the magnets 62 to drive the lower stage 18 in the Y direction with respect to the X beam 30. The lower stage 18 is guided along the guide surface 31 of the X beam, during Y direction movements, by the air bearing (not shown) attached to the inside of the lower stage opposite the guide surface 31.

As shown in FIG. 2, both the X magnets 52, as well as X beam guide 54 and X beam or follower guide 56 are mounted to reaction force supports 66, which are mounted directly to ground and which do not contact the base 50. Therefor, when the X motor coils are actuated to provide a driving force in the X direction, the equal and opposite force that is generated is applied against the reaction force supports 66 and transferred to ground without disturbing the base 50. Likewise, when the Y motor coils 36 are actuated to push on the Y magnet tracks 62, the equal and opposite reaction forces generated thereby are applied against the reaction force supports 66 and transferred to ground, without disturbing the base 50. In this manner, all forces in the X and Y directions acting on either the following frame 60 or the beam 30 are connected directly to ground through the reaction force supports 66, and do not couple with the base 50.

Figure 4:
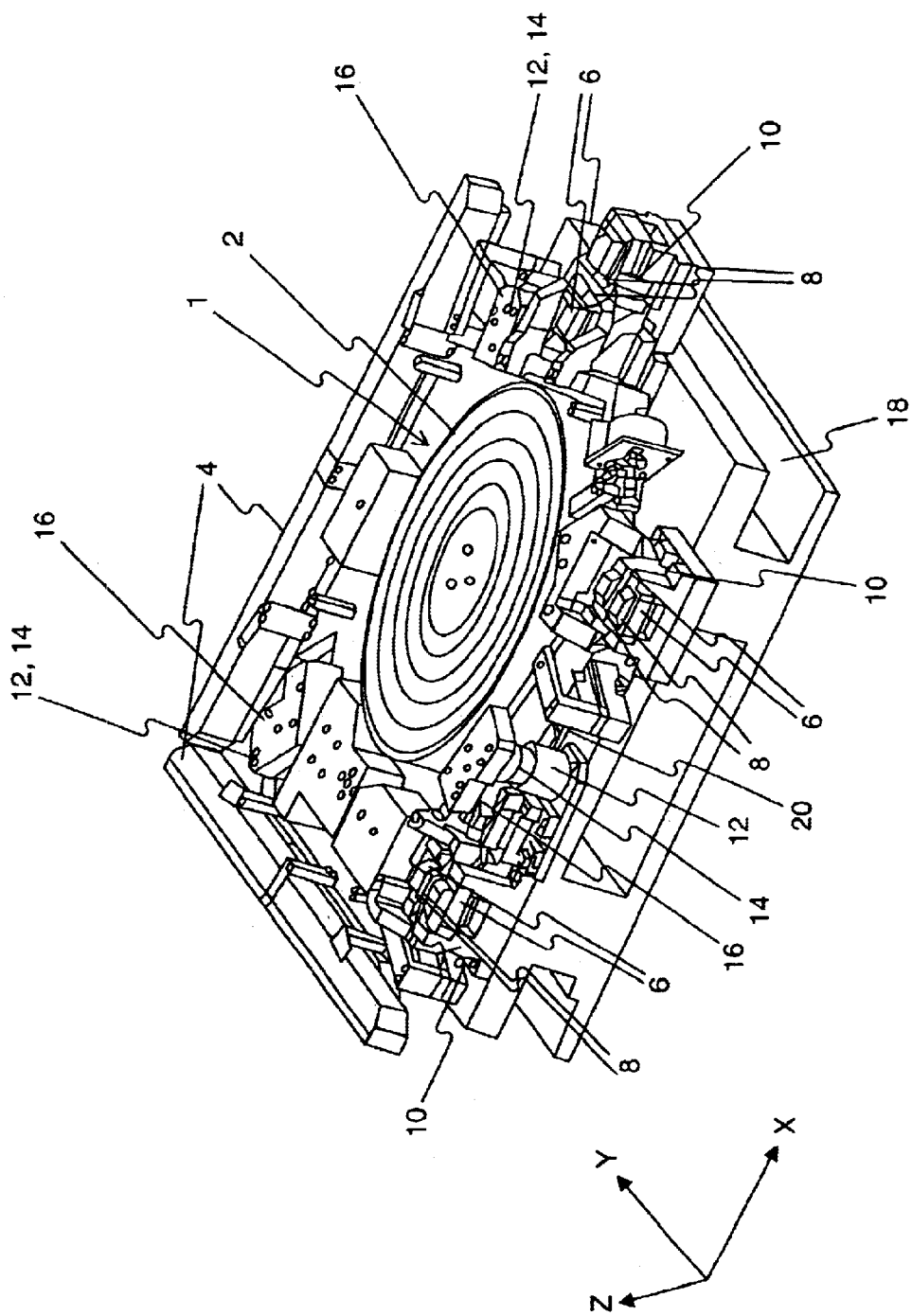
FIG. 4 is another perspective view of the fine stage mounted on the coarse stage according to principles of the invention.

The fine stage 1 is mounted to the lower stage 18 for small and precise movements in the X, Y and Theta Z (i.e. rotation in the X-Y plane) directions, as shown in FIGS. 4 and 5. The fine stage 1 includes a wafer chuck (holding portion) 2 on which a wafer can be mounted for precise positioning. Mirrors 4 are mounted on the fine stage 1 and aligned with the X and Y axes. The mirrors 4 provided reflective reference surfaces off of which laser light is reflected to determine a precise X-Y position of the fine stage 1 using a laser interferometer system, as a position detection device.

The position of the fine stage 1 in three planar degrees of freedom, X, Y, and Theta Z, is actuated using three pairs of electromagnets (actuating portion) 6 that are mounted to the lower stage 18. The electromagnets 6 are preferably formed as E-shaped laminated cores made of silicon steel or preferably Ni—Fe steel, that each have an electrical wire winding around the center section. Electromagnetic targets (relative moving portion) 8, preferably in the form of an I-shaped piece of magnetic material, and preferably made up of the same material or materials used to make the corresponding E-shaped laminated cores, are placed oppositely each of the electromagnets 6, respectively. Each electromagnet 6 and target 8 is separated by an air gap g (which is very small and therefor difficult to see in the figures). The electromagnets 6 are variable reluctance actuating portions and the reluctance varies with the distance defined by the gap g, which, of course also varies the flux and force applied to the target 8. The attractive force between the electromagnet and the target is defined by:

$$F = K(i/g)^2$$

where F is the attractive force, measured in Newtons;

K=an electromagnetic constant which is dependent upon the geometries of the "E-shaped" electromagnet 6, "I-shaped" target 8 and number of coil turns about the magnet. $K = \frac{1}{2} N^2 \mu_o wd$; where N=the number of turns about the E-shaped magnet core 8; $\mu_o$=a physical constant of about $1.26 \times 10^{-6}$ H/m; w=the half width of the center of the E-shaped core 8, in meters; and d=the depth of the center of the E-shaped core 8, in meters. In a preferred embodiment, $K = 7.73 \times 10^{-6}$ kg m$^3$/s$^2$A$^2$;

i=current, measured in amperes; and g=the gap distance, measured in meters.

When the coil of an electromagnet is energized, the electromagnet 6 generates a flux which produces an attractive force on the target 8 in accordance with the formula given above, thereby functioning as a linear actuating portion. Because the electromagnets 6 can only attract the targets 8, they must be assembled in pairs that can pull in opposition. The targets 8 are fixed to the fine stage 1 which is movable relative to the lower stage 18. Opposing pairs of electromagnets 6 are fixed on the relatively non-moveable (with respect to controlling movements of the fine stage 1) lower stage 18 on opposite sides of the targets 8. Thus, by making a flux generated by one of the electromagnets to be larger than the flux generated by the other in the pair, a differential force can be produced to draw the targets in one direction or its opposing direction.

The electromagnets' targets 8 are attached to the fine stage 1 in such a way that the pulling forces of the opposing pair of electromagnets 6 do not distort the fine stage 1. This is preferably accomplished by mounting the targets 8 for an opposing pair of electromagnets 6 very close to one another, preferably peripherally of the fine stage 1. Most preferred is to extend a thin web 9 of material (FIG. 5A), which is preferably made of the same material that the fine stage 1 is made of, preferably ceramic, such as silicon carbide or alumina, for example, from the periphery of the fine stage 1, onto which the targets 8 are mounted. The opposing electromagnets 6 are mounted on the lower stage 18 by a predetermined distance so that when the web 9 and targets 8 are positioned therebetween, a predetermined gap g is formed between each set of electromagnet 6 and target 8. With this arrangement, only the resultant force, derived from the sum of the forces produced by the pair of electromagnets 6 and targets 8, is applied to the fine stage 1 via transfer of the force through the web 9. In this way, opposing forces are not applied to opposite sides of the stage and stage distortion problems resulting from that type of arrangement are avoided.

In the above described arrangement, each pair of electromagnetic actuator devices is comprised of two actuating portions (electromagnets 6) and two moving portions (electromagnetic target 8). However, the invention is not restricted to this configuration. For example, the invention can use a combination of two actuating portions (electromagnets) and one moving portion (electromagnetic target 8). In this instance, the web 9 is provided with only one moving portion (electromagnetic target 8), and the moving portion (electromagnetic target 8) is interposed between two actuating portions (electromagnets 6) located on both side with a specific gap therebetween.

Figure 5A:
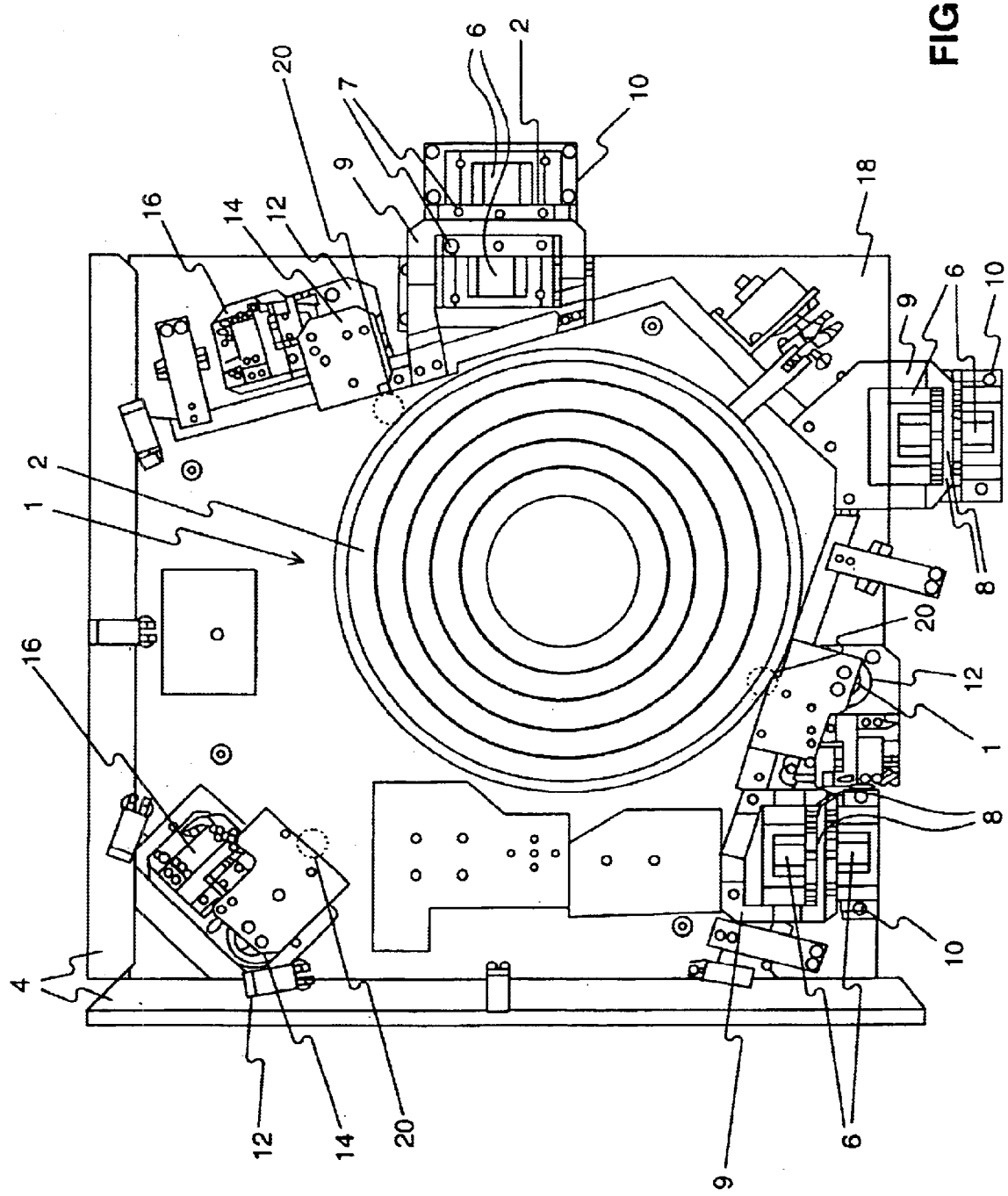
FIG. 5A depicts a top view of the fine stage mounted on the coarse stage.

FIG. 5A shows a preferred arrangement of the electromagnets 6 and targets 8 in which one opposing pair is mounted so that the attractive forces produced thereby are substantially parallel with the X direction of the stage. Two opposing pairs are mounted so that attractive forces from each pair are produced substantially parallel with the Y direction of the stage. With this arrangement, control of three degrees of freedom of the fine stage 1 can be accomplished, namely fine movements in the X, Y and Theta Z directions. Of course, two opposing pairs could be mounted parallel with the X direction and one pair parallel with the Y direction, to work equally as well as the shown preferred arrangement. Other arrangements are also possible, but the preferred arrangement minimizes the number of actuating portions/bearings required for the necessary degrees of control.

Typically, the lines of force of the actuating portions are arranged to act through the center of gravity (CG) of the fine stage 1. The two Y actuating portions are typically equidistant from the CG.

Actuation of the single pair of electromagnets 6 can achieve fine movements in either X direction. Actuation of the two pairs of electromagnets aligned along the Y axis can control fine movements of the fine stage 1 in either Y direction, or in rotation (clockwise or counterclockwise) in the X-Y plane (i.e., Theta Z control). Y axis movements are accomplished by resultant forces from both pairs which are substantially equal and in the same direction. Theta Z movements are generally accomplished by producing opposite directional forces from the two pairs of electromagnets, although unequal forces in the same direction will also cause some Theta Z adjustment.

Three short range sensors 10 measure the distance between the fine stage 1 and the lower stage 18 in the three planar degrees of freedom. The fine stage 1 is also levitated in the three vertical degrees of freedom, Z, Theta X and Theta Y. Because control in the three vertical degrees of freedom requires less dynamic performance (e.g., acceleration requirements are relatively low) and is easier to accomplish, lower force requirements exist than in the previously described X, Y and Theta Z degrees of freedom. Thus, the use of three VCM (voice coil motor) magnets 12 attached to the lower stage 18 and three VCM coils 14 attached to the fine stage 1 are satisfactory for the vertical levitation. The relative position in the three vertical degrees of freedom is measured using three linear sensors 16. To prevent overheating of the VCM coils 14 the dead weight of the fine stage 1 is supported by air bellows 20. Preferably, three air bellows are employed and respectively located next to the VCMs. The bellows 20 have reasonably low stiffness in all degrees of freedom so they do not significantly interfere with the control of the fine stage 1.

Figure 5B:
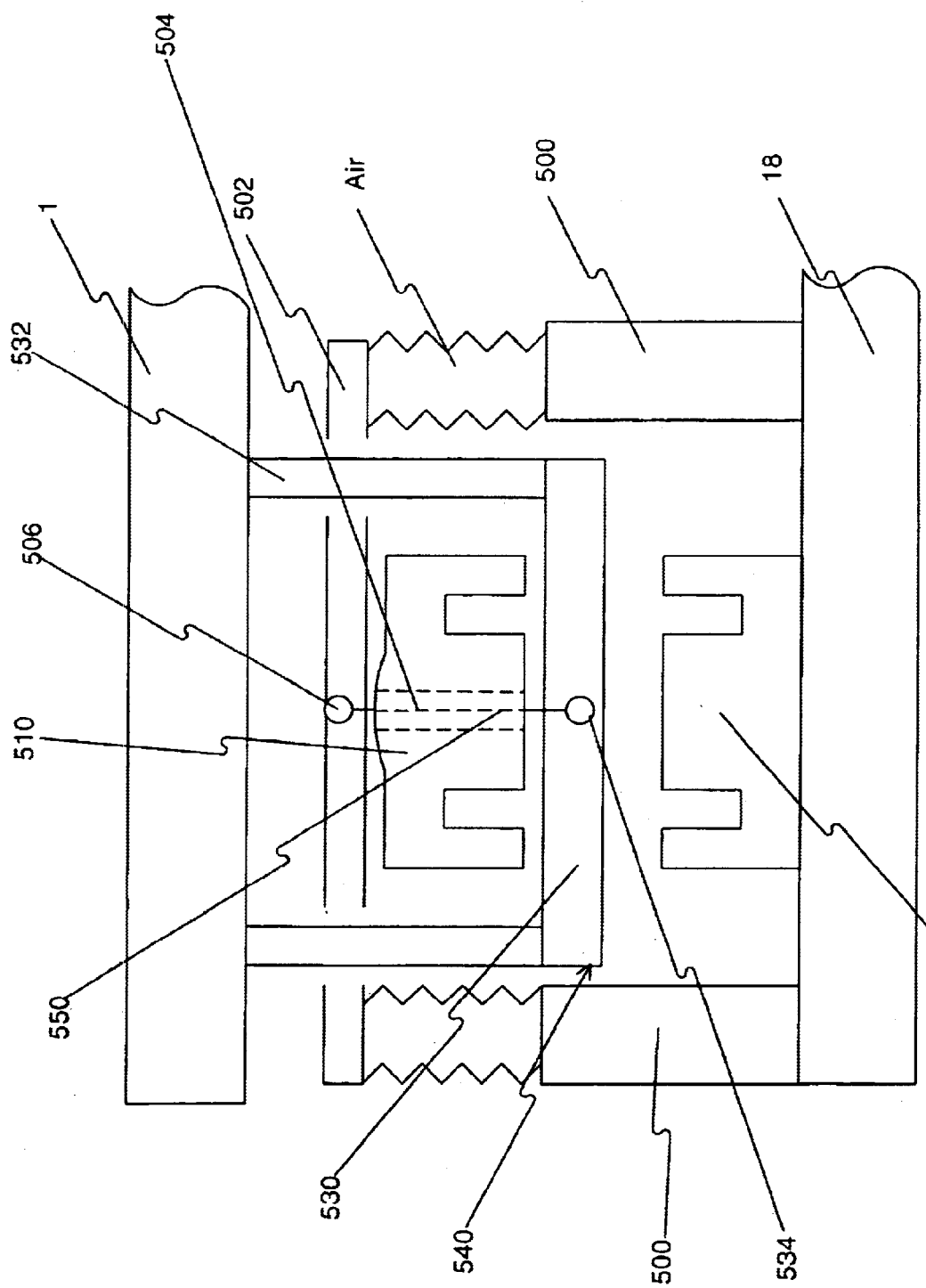
FIG. 5B depicts schematic vertical cross-sectional view of an electromagnetic actuator device controlling the position of the fine stage in the vertical direction.

When the heat generation by the VCMs or the lateral stiffness of air bellows is more critical to the system in which the stage device is employed, the configuration shown in FIG. 5B replaces the combination described above comprising the VCM and the air bellows for supporting the fine stage 1 in the vertical direction.

The basic configuration is that the fine stage 1 is suspended from a suspending bar 502, which is supported by a pair of air bellows 500, using a wire 504 connecting the bar 502 and an electromagnetic target 530 that is rigidly mounted on the fine stage 1 and electromagnetically coupled with electromagnets 510, 520 for controlling the stage 1 in the vertical direction. The air bellows 500 is rigidly mounted on the lower stage 18 very close to the electromagnet 520, and filled with pressurized air for supporting the suspending bar 502. In this embodiment only two air bellows 500 support the suspending bar 502, however the number of the air bellows is not confined to this number (2). The suspending bar 502 is connected to the electromagnetic target 530 of an electromagnetic actuator device 540 by the wire 504. The electromagnetic actuator device 540 comprises a pair of E-shaped electromagnets 510, 520, and one common I-shaped electromagnetic target 530 interposed between the two electromagnets 510, 520. The upper electromagnet 510 and lower electromagnet 520 are rigidly mounted on the lower stage 18 (supporting portion for the upper electromagnet 510 is not shown in the figure), and electromagnetically coupled with the electromagnetic target 530 that is rigidly mounted on the fine stage 1 by a pair of limbs 532. The detailed configuration and the operation mechanism of the electromagnetic actuator device 540 is the same as those described in conjunction with FIGS. 4 and 5A. A vertical hole 550 is formed within the upper electromagnet 510 for allowing the wire 504 to extend from a connecting portion 506 located in the center of the suspending bar 502 to another connecting portion 534 located in the center of the electromagnetic target 530 for carrying the bellows force to the electromagnetic target 530.

In this configuration, the electromagnetic force for control in the vertical direction generated by the electromagnetic actuator device 540 as well as the supplemental vertical force provided by the air bellows 500 acts on the same electromagnetic target 530. In the prior art design, the air bellows 500 and the electromagnetic actuator device 540 are located at different places. In such a configuration, when the air bellows 500 has too much air pressure and produces extra force up on the fine stage 1, the electromagnetic actuator device 540 must generate a downward force, leading to a deformation of the fine stage 1 as the two forces act at different points on the fine stage 1. This undesirable deformation of the fine stage 1 is, however, avoided in the invention since the two different forces act on the same electromagnetic target 530 that is mounted on the fine stage 1.

This configuration also avoids problems arising from the inevitable lateral stiffness of the air bellows 500. Although it may not be stiff enough to be a problem in some applications, the lateral stiffness of the air bellows 500 can affect the planar positioning of the fine stage 1 in other applications. In this embodiment, since the fine stage 1 is suspended by a wire 504, it is much more flexible in the lateral motions than the prior art design in which the fine stage 1 is directly supported by the air bellows 500. Thus, the configuration of the invention allows the electromagnetic target 530 to make small horizontal and rotational motions without being affected by the position of the air bellows 500 or the suspending bar 502. The wire 504 may be replaced by a thin flexible rod, since the rod is only used in tension and can be thin enough to flexibly support the fine stage 1.

Furthermore, the use of the electromagnetic actuator device 540 comprising the electromagnets 510, 520 and the electromagnetic target 530 reduces power consumption in comparison to the use of the voice coil motors, leading to less heat generation. The efficiency of the power consumption is further improved when the electromagnets 510, 520 comprise variable reluctance actuating portions that varies its reluctance with the distance defined by the gap between the electromagnets 510, 520 and the electromagnetic target 530. Additionally, the use of the electromagnetic actuator device 540 improves the dynamic performance of the fine stage 1 when acceleration requirement are relatively high in a system design.

Although the embodiment shown in FIG. 5B uses an electromagnetic actuator device 540 that has one common electromagnetic target 530 for electromagnetically coupling two electromagnets 510, 520, other configurations of the electromagnetic actuator device 540 are possible. For example, a pair of electromagnetic actuator devices, which is described above for the planar control of the fine stage 1 in conjunction with FIGS. 4 and 5A, may replace the electromagnetic actuator device 540 shown in FIG. 5B. In such a case, the wire 504 extending from the suspending bar 502 through a hole 550 formed within an upper electromagnetic actuator device of the pair may be connected only to the electromagnetic target of the upper electromagnetic actuator device. As another example, it is possible to eliminate the upper electromagnet 510, leaving only one electromagnetic actuator device 540 comprising one electromagnet 520 and one electromagnetic target 530. In this case, the electromagnetic actuator device 520 can only pull down the fine stage 1 suspended by the bellows force. However, the configuration shown in FIG. 5B is preferable because it consumes less space, the electromagnetic force and the supplemental vertical force act on the same member of the electromagnetic actuator device, and the fine stage 1 can be levitated by the electromagnetic force. It is also possible to replace the air bellows 500 by other supplemental vertical support including a permanent magnet when the use of air bellows is not adequate.

Furthermore, the suspending bar 502 may not be necessary for carrying the bellows force to the fine stage 1. For example, the air bellows 500 may directly support the electromagnetic target 530, the limb 532, or the fine stage 1 at a location very close to the electromagnet 520 mounted on the lower stage 18. This configuration is easier to accomplish and still manage to have the supplemental vertical force acting on the same mechanical member, or at least the substantially same portion of the stage as the mechanical member, as the electromagnetic force does. However, the configuration shown in FIG. 5B is preferred as such a configuration reduces the lateral flexibility of the fine stage 1.

Preferably, the vertical support mechanisms described above, each of which comprises a combination of an electromagnetic actuator device 540 and the air bellows 500, are disposed at three locations underneath the fine stage 1 denoted by three broken circles 20 shown in FIG. 5A. In this configuration, the fine stage 1 is controllable in three vertical degrees of freedom, namely, Z axis movement, Theta X rotation, and Theta Y rotation. However, the member of the vertical support mechanisms is not confined to the number of this embodiment (3).

Figure 6:
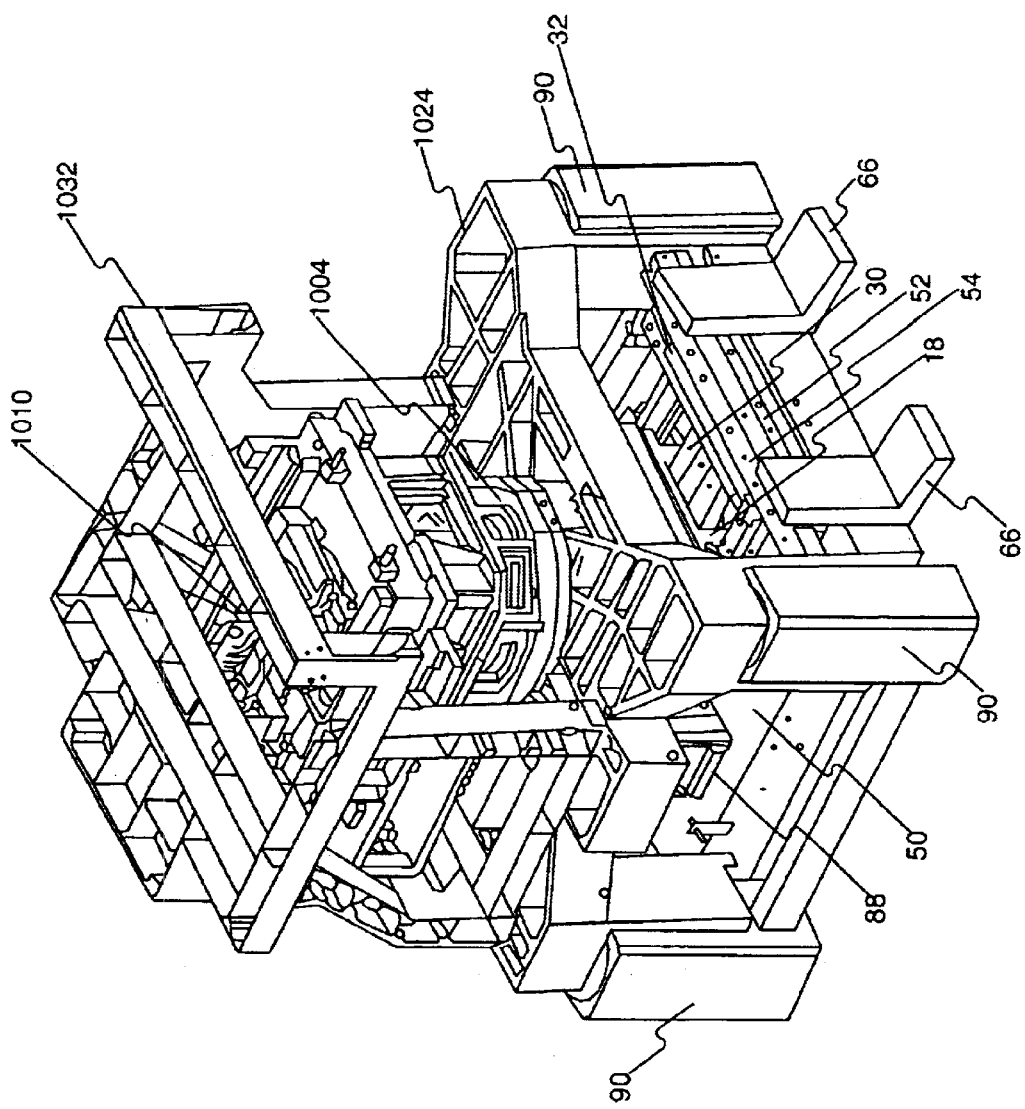
FIG. 6 is a perspective view of a lithography system according to principles of the invention.

Now referring to FIG. 6, the base 50 is rigidly attached to the body 1024. The complete body assembly is isolated from the ground by vibration isolators 90. Isolation mounts that are typically used are the "Electro-Damp Active Vibration Control System", available from Newport Corporation of Irvine Calif. The planar position of the fine stage 1, relative to the lens 1004, is measured using interferometers 88 which reflect laser light from interferometer mirrors 4, as alluded to above. The vertical position of the stage is measured using a focus and level sensor (not shown) which reflects light from the wafer surface.

Figure 7:
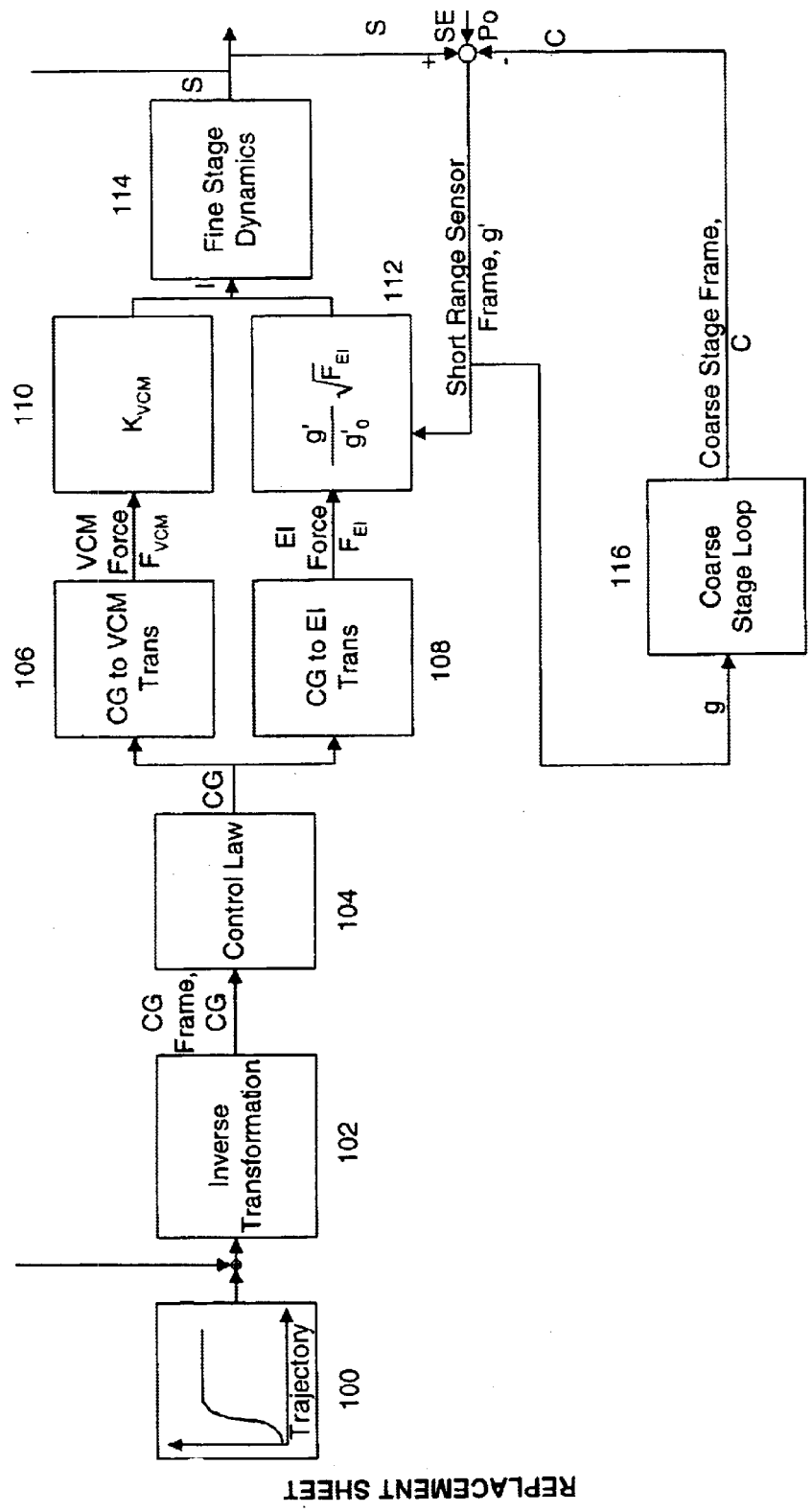
FIG. 7 is a schematic describing the sensing and control functions of the present device.

FIG. 7 is a schematic which describes the sensing and control functions of the present device. The sensing and control functions are more thoroughly described in copending U.S. patent application Ser. Nos. 09/022,713 filed Feb. 12, 1998, Ser. No. 09/139,954 filed Aug. 25, 1998, and Ser. No. 09/141,762, filed Aug. 27, 1998, each of which is hereby incorporated by reference thereto, in their entireties. A trajectory 100, or desired path for the focused optical system to follow is determined based on the desired path of the wafer or other object to which the focused optical system is to be applied. The trajectory 100 is next fed into the control system. The trajectory 100 is compared with a sensor signal vector S which is generated from the output of interferometer 88 and focus and level sensor. The difference vector which results from the comparison is transformed to a CG (center of gravity) coordinate frame through an inverse transformation 102. The control law 104 prescribes the corrective action for the signal. The control law may be in the form of a PID (proportional integral derivative) controller, proportional gain controller or preferably a lead-lag filter, or other commonly known law in the art of control, for example.

The vector for vertical motion is fed to the CG to VCM transformation 106. This transforms the CG signal to a value of force to be generated by the VCMs or EI-core electromagnetic actuator device, which is then fed to the VCM gain 110, and output to the stage hardware 114. The vector for planar motion is fed to the CG to EI-core transformation, 108. This transforms the CG signal to a force to be generated by the EI-core force (i.e., electromagnet and target arrangements 6,8). Because the EI-core force depends upon the gap squared, it is compensated by the short range sensor vector g' through the compensation block 112, to produce a linear output to the stage hardware 114. The stage hardware 114 responds to the input and is measured in the sensor frame S. A similar block is not shown in detail below for the coarse stage loop 116. The coarse frame position C, is computed using the fine stage position S and the gap g. This is served to follow the fine stage 1.

Figure 8:
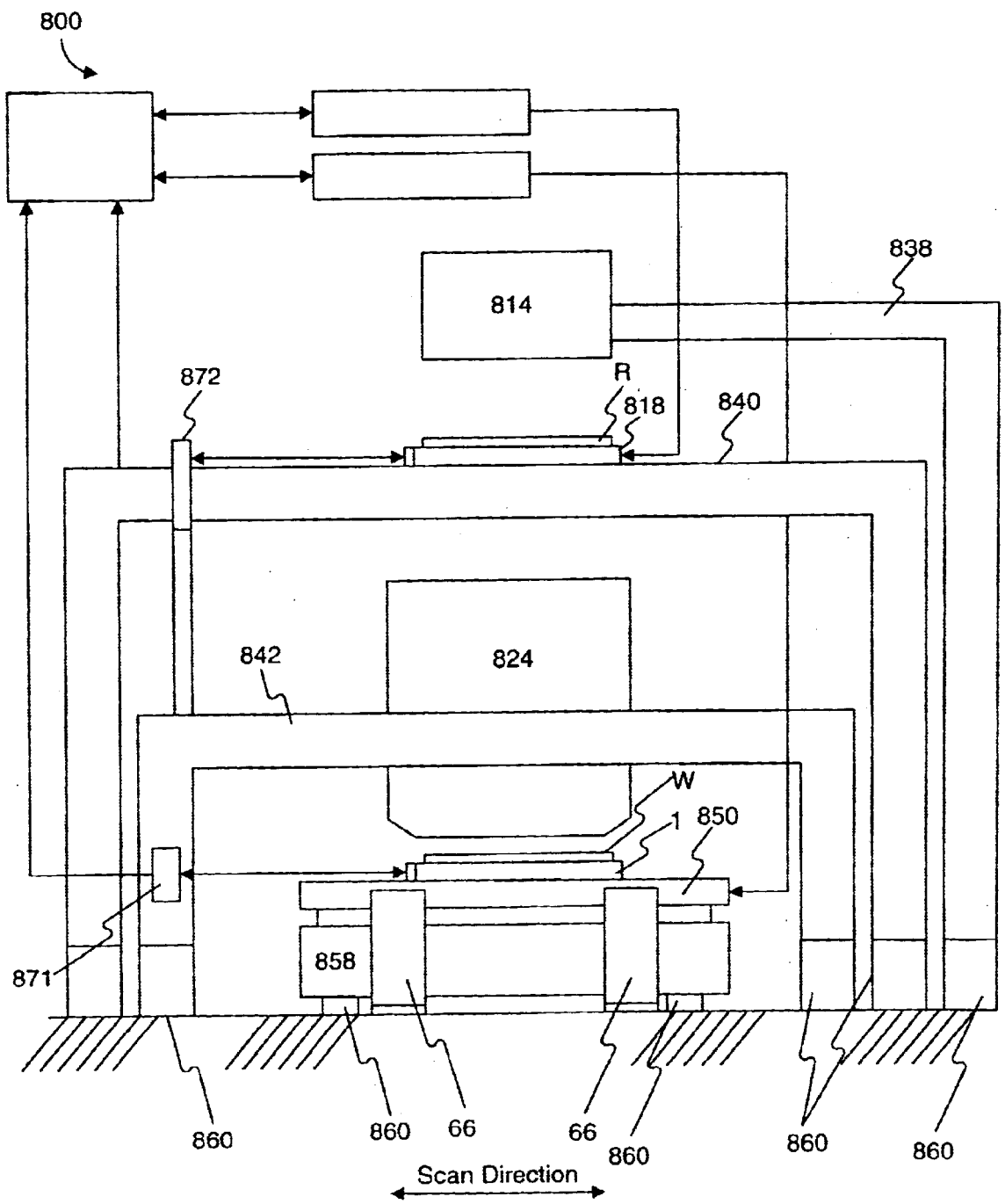
FIG. 8 is another schematic view illustrating a photolithographic instrument incorporating an additional embodiment of a wafer stage according to principles of the invention.

FIG. 8 is a schematic view illustrating an additional embodiment of an exposure apparatus 800 useful with the invention. A motor 850 (for coarse positioning) for driving the fine wafer stage 1 includes a support plate and a coil array (not separately shown). The support plate portion of the motor 850 is supported by a base 858 coupled to the ground by damping means 860, such as air or oil dampers, voice coil motors, actuating portions, or other known vibration isolation systems. The coil array portion of the motor 850 is separately and rigidly coupled to the ground by reaction force supports 66 previously described hereinabove. An illumination system 814, reticle stage 818 and projection optics 824 are respectively supported by an illumination system frame 838, reticle stage frame 840 and projection optics frame 842 which may also be coupled to the ground by similar damping means 860. In this embodiment, when reaction forces are created between the coil array and the wafer stage, the reaction forces push against the ground. Because of the large mass of the ground, there is very little movement of the coil array from the reaction forces. By providing the damping means 860 to couple the base 858 and the illumination system frame 838, the reticle stage frame 840 and the projection optics frame 842 to the ground, any vibration that may be induced by the reaction forces through the ground is isolated from the rest of the exposure apparatus 800.

Additionally, in the embodiment shown in FIG. 8, the reaction force supports 66 may include at least one actuator system that generates a force to cancel the reaction force created between the coil array and the magnet array. By providing the actuator system, the vibration transferred to the ground is decreased. The actuator system may be an actuator which can generate a force in six degrees of freedom (6-DOF). Additional features of the exposure apparatus 800 shown in FIG. 8 include interferometers (position detection devices) 871 and 872 supported by the projection optics frame 842. A first interferometer 871 detects the position of the fine stage 1 and outputs the information of the position of the first stage of a main controller (not shown). A second interferometer 872 detects the position of the reticle stage 818 to the main controller. The main controller drives the wafer fine stage 1 for coarse and/or fine positioning via a wafer drive controller based on the information outputted from the first interferometer 871. Further, the main controller drives the reticle stage 818 via a reticle drive controller based on the information outputted from the second interferometer 872. In this structure, position information of the fine stage 1 and the reticle stage 818 are unaffected by vibration in the fine stage 1 and the reticle stage 818, since the interferometer 871 and 872 are isolated with respect to the stages.

The embodiment described in the above example applies principles of the invention to a wafer stage. However, the invention can also be applied to a reticle (mask) stage. For example, referring back to FIG. 1, reaction forces generated by movement of the reticle stage 1010 can mechanically released to the ground (floor) by using a support frame member such as the reaction force support frame 66 previously described. In this case, the support frame member is isolated from the frames 1026, 1030, 1032 and 1034, the illumination system 1002, the optical system 1004, the body 1024 and the wafer fine stage 1. The stator (coil member or magnet member) of the motor of the reticle stage 1010 is fixed to the frame support member.

As described herein, the various embodiments of the invention have been shown and described such that the actuating portions (electromagnets) of the electromagnetic actuating devices are mounted on the supporting stage and the relative moving portions (targets) of the electromagnetic actuating devices are mounted on the stage (fine stage). However, other arrangement are possible. For example, the actuating portions (electromagnets) could be mounted on the stage (fine stage), and the relative moving portions (targets) could be mounted on the supporting stage.

There are a number of different types of lithographic devices. For example, the exposure apparatus can be used as scanning type exposure device that provides synchronized movement of the mask(reticle) and wafer for exposure of the mask pattern. In such a scanning type device, scanning can be conducted in either the X direction or the Y direction. The scanning type exposure device can be, for example, that disclosed in U.S. Pat. No. 5,473,410. As far as is permitted, the disclosure of U.S. Pat. No. 5,473,410 is incorporated herein by reference.

Alternately, the exposure apparatus can be a step-and-repeat type exposure device that exposes the mask (reticle) while the reticle and the wafer are stationary. In the step and repeat process, the wafer is in a constant position relative to the reticle and the lens assembly during the exposure of an individual field. Subsequently, between consecutive exposure steps, the wafer is consecutively moved by the wafer stage perpendicular to the optical axis of the lens assembly so that the next field of the wafer is brought into position relative to the lens assembly and reticle for exposure. Following this process, the images on the reticle are sequentially exposed onto the fields of the wafer, and then the next field of the wafer is brought into position relative to the lens assembly and the reticle.

However, the use of the exposure apparatus provided herein is not limited to a photolithography system for semiconductor manufacturing. The exposure apparatus, for example, can be used as an LCD photolithography system that exposes a liquid crystal display device pattern onto a rectangular glass plate or a photolithography system for manufacturing a thin film magnetic head. Further, the invention can also be applied to a proximity photolithography system that exposes a mask pattern by closely locating a mask and substrate without the use of a lens assembly. Additionally, the invention provided herein can be used in other devices, including other semiconductor processing equipment, machine tools, metal cutting machines, and inspection machines.

The illumination source of the illumination system 1002 or 814 can be g-line (436 nm), i-line (365 nm), KrF excimer laser (248 nm), ArF excimer laser (193 nm) and $F_2$ laser (157 nm). Alternately, the illumination source can also use charged particle beams such as x-ray and electron beam. For instance, in the case where an electron beam is used, thermionic emission type lanthanum hexaboride (LaB6) or tantalum (Ta) can be used as an electron gun. Furthermore, in the case where an electron beam is used, the structure could be such that either a mask is used or a pattern can be directly formed on a substrate without the use of a mask.

In terms of the magnification of the lens assembly of the lens system 1004 or the projection optics 824 included in the photolithography system, the lens assembly need not be limited to a reduction system. It could be a 1× or magnification system.

With respect to a lens assembly, when far ultra-violet rays such as the excimer laser is used, glass materials such as quartz and fluorite that transmit far ultra-violet rays is preferable to be used. When the $F_2$ type laser or X-ray is used, the lens assembly should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (UVU) of wavelength b 200nm or lower, use of the catadioptric type optical system can be considered. Examples of the catadioptric type optical system include the disclosure Japan Patent Application Disclosure No. 8-171054 published in the Official Gazette for Laid-Open Patent Applications Disclosure No. 10-20195 and its counterpart U.S. Pat. No. 5,835,257. In these cases, the reflecting optical device can be a catadioptric optical system incorporating a beam splitter and concave mirror. Japan Patent Application Disclosure No. 8-334695 published in the Official Gazette for Laid-Open Patent Applications Disclosure and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference. Further, in photolithography systems, when linear motors (see U.S. Pat. Nos. 5,623,853 or 5,528, 118) are used in a wafer stage or a mask stage, the linear motors can be either an air levitation type employing air bearings or a magnetic levitation type using Lorentz force or reactance force. Additionally, the stage could move along a guide, or it could be a guideless type stage which uses no guide. As far as is permitted, the disclosures in U.S. Pat. No 5,623,853 and 5,528,118 are incorporated herein by reference.

Movement of the stages as described above generates reaction forces which can affect performance of the photolithography system. Reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. No. 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and cleanliness are controlled.

Figure 9:
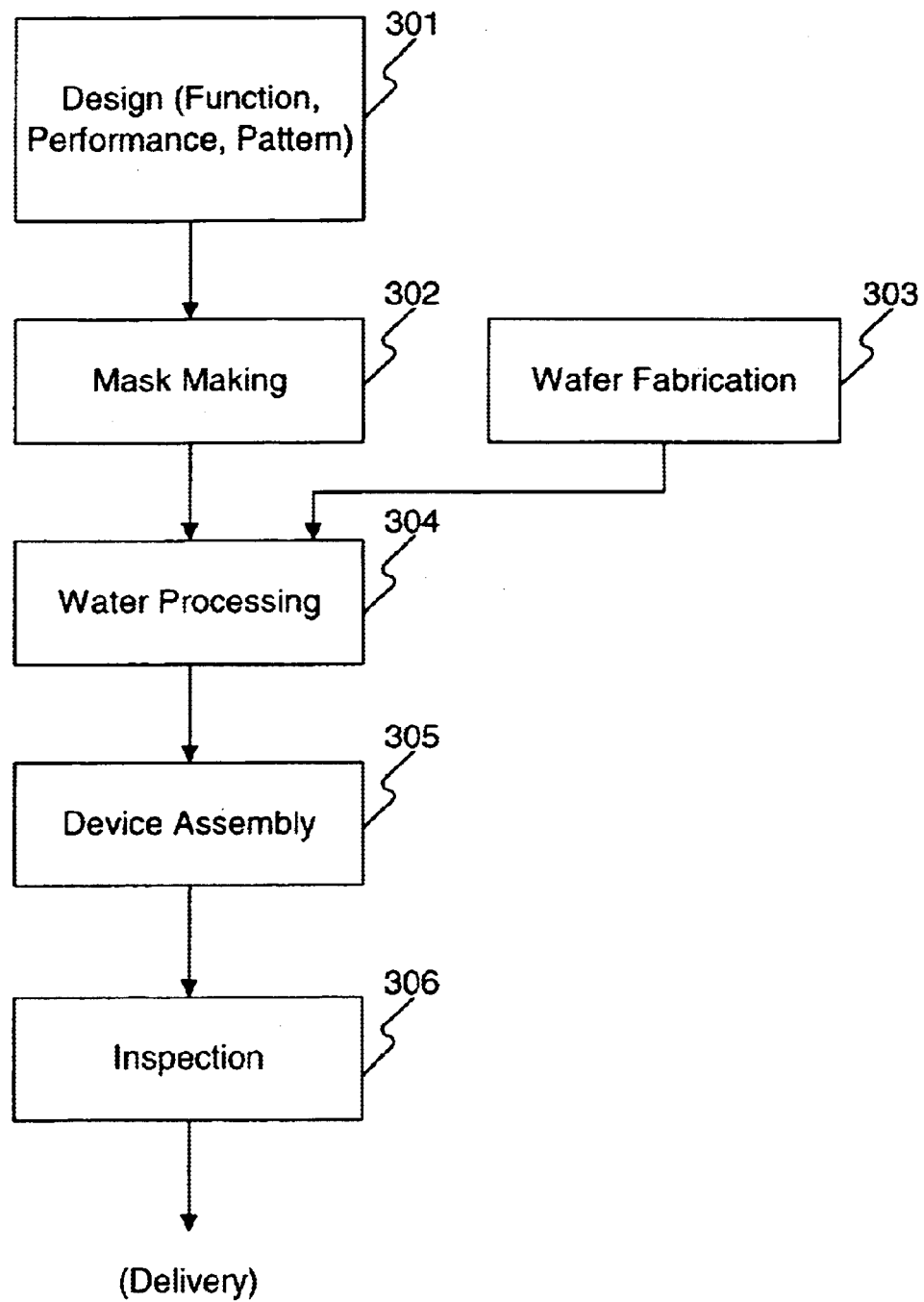
FIG. 9 is a flow chart that outlines a process for manufacturing a device in accordance with the invention.

Further, semiconductor devices can be fabricated using the above described systems, by the process shown generally in FIG. 9. In step 301 the device's function and performance characteristic are designed. Next, in step 302, a mask (reticle) having a pattern is designed according to the previous designing step, and in a parallel step 303 a wafer is made from a silicon material. The mask pattern designed instep 302 is exposed onto the wafer from step 303 in step 304 by a photolithography system described hereinabove in accordance with the invention. In step 305 the semiconductor device is assembled (including the dicing process, bonding process and packing process), then finally the device is inspected in step 306.

Figure 10:
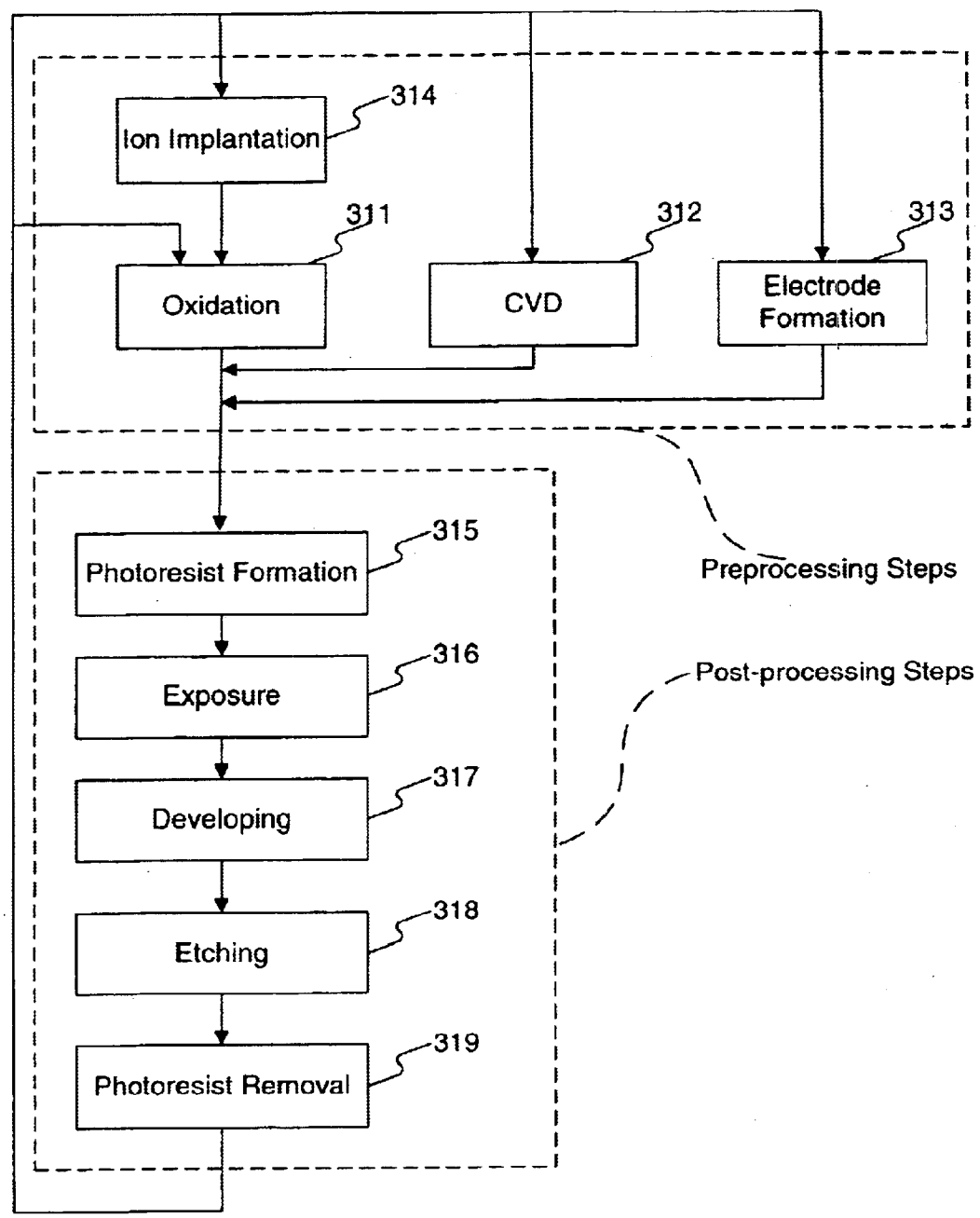
FIG. 10 is a flow chart that outlines device processing in more detail.

FIG. 10 illustrates a detailed flowchart example of the above-mentioned step 304 in the case of fabricating semiconductor devices. In FIG. 10, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, firstly, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface)

are removed by etching. In step 319 (photoresist removal step), unnecessary photoresist remaining after etching is removed.

Multiple circuit patterns are formed by repetition of these preprocessing and post-processing steps.

It is to be understood that a photolithographic instrument may differ from the one shown herein without departing from the scope of the invention. It is to be further understood that the bearings and drivers of an instrument may differ from those shown herein without departing from the scope of the invention. It is also to be understood that the application of the inventions is not to be limited to a wafer processing apparatus. While embodiments of the invention have been shown and described, changes and modifications to these illustrative embodiments can be made without departing from the invention in its broader aspects, described in the appended claims.

What is claimed is:

1. A stage device comprising:
   a stage controllable in at least one degree of freedom;
   a supporting stage; end
   at least one pair of electromagnetic actuator devices that couple said stage to said supporting stage for control in at least one of said degrees of freedom, each electromagnetic actuator device comprising an actuating portion and a relative moving portion that is movable relative to said actuating portion, the actuating portion or the relative moving portion of said pair of electromagnetic actuator devices being mounted adjacent a single side of said stage in association with a direction of force produced by said pair of electromagnetic actuator devices,
   wherein each of the at least one pair of electromagnetic actuator devices is configured to vary a gap between portions of each of the at least one pair of electromagnetic actuator devices.

2. The stage device of claim 1, wherein said actuating portion of said electromagnetic actuator device is mounted on said supporting stage, and said relative moving portion of said electromagnetic actuator device is mounted to said stage adjacent to said actuating portion within a predetermined gap defined by said electromagnetic actuator device.

3. The stage device of claim 1, wherein one relative moving portion is used as both of said relative moving portions of said pair of electromagnetic actuator devices.

4. The stage device of claim 2, wherein both of said actuating portions of said pair of electromagnetic actuator devices are mounted on said supporting stage, and a pair of corresponding relative moving portions are mounted on said stage adjacent one another and within a predetermined gap defined by said electromagnetic actuator devices.

5. The stage device of claim 4, wherein said pair of corresponding relative moving portions are peripherally mounted on said stage.

6. The stage device of claim 5, further comprising at least one mount member that extends from said stage, wherein said pair of corresponding relative moving portions are mounted on said mount member such that a resultant force from actuation of said pair of electromagnetic actuator devices is transferred to said stage through said mount member.

7. The stage device of claim 1, wherein said stage is positionally controllable in at least three degrees of freedom, said at least one pair of electromagnetic actuator devices comprising at least three pairs of electromagnetic actuator devices.

8. The stage device of claim 7, wherein two of said at least three pairs of electromagnetic actuator devices are aligned substantially parallel to a first direction, and a third of said at least three pairs of electromagnetic actuator devices is aligned in a second direction substantially perpendicular to said first direction.

9. The stage of claim 8, wherein said first and said second directions are within a plane in which a main surface of said stage substantially lies.

10. The stage device of claim 8, wherein said first direction is substantially parallel to a moving direction of said supporting stage.

11. The stage device of claim 1, wherein said electromagnetic actuator device comprises a variable reluctance actuator.

12. The stage device of claim 1, wherein said at least one pair of electromagnetic actuator devices comprises three pairs of electromagnetic actuator devices that interconnect said stage and said supporting stage and are actuable to control said stage in three degrees of freedom.

13. The stage device of claim 12, further comprising at least one additional electromagnetic actuator device mounted between said stage and said supporting stage and actuable to control said stage in at least one additional degree of freedom.

14. The stage device of claim 13, further comprising at least one supplemental vertical support mounted between said stage and said supporting stage, and disposed at the substantially same location relative to the stage as said additional electromagnetic actuator device.

15. The stage device of claim 13, further comprising:
    a plurality of supplemental vertical supports, for each of said additional electromagnetic actuator devices, mounted between said stage and said supporting stage, and disposed at the substantially same location relative to the stage as said additional electromagnetic actuator device; and
    a suspending member that is supported by said plurality of supplemental vertical supports and flexibly supports the stage.

16. The stage device of claim 15, wherein said additional electromagnetic actuator device comprises at least one additional pair of electromagnetic actuator devices disposed adjacent each other, each electromagnetic actuator device comprising an actuating portion and a relative moving portion that is movable relative to said actuating portion in a vertical direction, and one of said actuating portion and said relative moving portion is mounted on said stage and the other of said actuating portion and said relative moving portion is mounted on said supporting stage.

17. The stage device of claim 16, further comprising a flexible member that connects the suspending member and at least one of the relative moving portions of said additional pair of electromagnetic actuator devices.

18. The method of claim 17, wherein the flexible member connects the suspending member and the at least one of the relative moving portions of said additional pair of electromagnetic actuator devices through a hole formed vertically within the actuating portion positioned above said at least one of the relative moving portions of said additional pair of electromagnetic actuator devices.

19. The stage device of claim 16, wherein one relative moving portion of said additional pair of electromagnetic actuator devices is used as both of said relative moving portions of said additional pair of electromagnetic actuator devices, said two actuating portions of said additional pair of electromagnetic actuator devices are vertically aligned with said one relative moving portion interposed between the two actuating portions.

20. The stage device of claim 12, wherein said electromagnetic actuator device comprises a variable reluctance actuator.

21. The stage device of claim 13, wherein said electromagnetic actuator devices and said additional electromagnetic actuator device comprise a variable reluctance actuator.

22. The stage device of claim 13, wherein said additional electromagnetic actuator device comprises a voice coil motor.

23. The stage device of claim 13, wherein said at least one additional electromagnetic actuator device comprises three additional electromagnetic actuator devices mounted between said stage and said supporting stage and actuable to control said stage in three degrees of freedom.

24. The stage device of claim 14, wherein said at least one additional electromagnetic actuator device comprises three additional electromagnetic actuator devices mounted between said stage and said supporting stage and actuable to control said stage in three degrees of freedom, and said at least one supplemental vertical support comprises three supplemental vertical supports, each of said three supplemental vertical supports being disposed at the substantially same location as a corresponding electromagnetic actuator device of said three additional electromagnetic actuator devices.

25. The stage of claim 15, wherein said at least one additional electromagnetic actuator device comprises three additional electromagnetic actuator devices mounted between said stage and said supporting stage and actuable to control said stage in three degrees of freedom, said plurality of supplemental vertical supports being provided for each of said three additional electromagnetic actuator devices and being disposed at the substantially same location as a corresponding electromagnetic actuator device of said three additional electromagnetic actuator devices.

26. The stage device of claim 22, wherein said pairs of electromagnetic actuator devices comprise variable reluctance actuators and said stage further comprises supplemental vertical supports mounted between said stage and said supporting stage.

27. The stage device of claim 14 or 26, wherein at least one of said supplemental vertical supports comprises air bellows.

28. The stage device of claim 1, further comprising at least one non-contact vertical support member that levitates said stage above said supporting stage.

29. The stage device of claim 28, further comprising at least one supplemental vertical support mounted between said stage and said supporting stage, and disposed at the substantially same location relative to the stage as said non-contact vertical support member.

30. The stage device of claim 28, wherein said at least one non-contact vertical support member comprises three non-contact vertical support members that controls the position of said stage in three vertical degrees of freedom.

31. The stage device of claim 29, wherein said at least one non-contact vertical support member comprises three non-contact vertical support members that controls the position of said stage in three vertical degrees of freedom, and said at least one supplemental vertical support comprises three supplemental vertical supports, each of said three supplemental vertical supports being disposed at the substantially same location as a corresponding non-contact vertical support member of said three non-contact vertical support member.

32. The stage of claim 28, wherein each said non-contact vertical support member comprises an electromagnetic actuator device.

33. The stage device of claim 29, wherein each said non-contact vertical support member comprises an electromagnetic actuator device, and each said supplemental vertical support comprises air bellows.

34. The stage device of claim 30, wherein each said non-contact vertical support member comprises a voice coil motor having a magnet portion and a coil portion, one of said magnet portion and said coil portion being mounted on said stage and the other of said magnet portion and said coil portion being mounted on said supporting stage.

35. The stage device of claim 31, wherein each said non-contact vertical support member comprises a pair of electromagnetic actuator devices disposed adjacent each other, each electromagnetic actuator device comprising an actuating portion and a relative moving portion that is movable relative to said actuating portion in a vertical direction, and one of said actuating portion and said relative moving portion is mounted on said stage and the other of said actuating portion and said relative moving portion is mounted on said supporting stage.

36. The stage device of claim 28, further comprising at least one dead weight support for vertically supporting a dead weight of said stage.

37. The stage device of claim 28, further comprising at least one bellows that couples said stage and said supporting stage and vertically supports a dead weight of said stage.

38. The stage device of claim 37, wherein said at least one bellows comprises three bellows.

39. The stage device of claim 1, further comprising:
a driving device that moves said supporting stage, and comprises a first portion connected to said supporting stage and a second portion that is movable relative to said first portion;
a base member that guides supporting stage in at least one direction; and a
supporting member that supports said second portion of said driving device.

40. The stage device of claim 39, wherein said driving device moves said supporting stage in a first direction and a second direction substantially perpendicular to said first direction.

41. The stage device of claim 39, wherein the force acting on said supporting stage is connected directly to ground through said supporting member without coupling with said base member.

42. The stage device of claim 39, wherein said base is isolated from a route of a reaction force generated by actuation of said driving device.

43. The stage device of claim 39, further comprising at least one position detection device that detects a position of said stage, said position detection device being connected to a member that is not coupled with said supporting member.

44. A lithography system comprising:
an illumination system that irradiates radiant energy; and
the stage device according to any of claims 1 to 26 or any one of claims 28 to 43, said stage device carrying an object disposed on a path of said radiant energy.

45. The lithography system of claim 44, further comprising an optical system and said supporting stage substantially aligned with said optical system.

46. The lithography system of claim 44, further comprising a mask stage that holds a mask having a pattern, and said mask is positioned between said illumination system and said stage.

47. The lithography system of claim 45, further comprising a frame that supports at least one of said illumination system and said optical system, and is dynamically isolated from said stage device.

48. The lithography system of claim 46, wherein said optical system is positioned between said mask and said stage.

49. A device on which an image has been formed by the lithography system of claim 44.

50. A method of making a stage device comprising:
providing a stage that is controllable in at least one degree of freedom;
providing a supporting stage;
providing at least one pair of electromagnetic actuator devices coupling said stage to said supporting stage for control in at least one of said degrees of freedom, wherein each electromagnetic actuator device comprises an actuating portion and a relative moving portion that is movable relative to said actuating portion, both actuating portions or both relative moving portions of said pair of said electromagnetic actuator devices being mounted adjacent a single side of said stage in association with a direction of force produced by said pair of electromagnetic actuator devices, and
varying a gap between portion of each of the at least one pair of electromagnetic actuator devices.

51. A method of making a lithography system comprising:
providing an illumination system that irradiates radiant energy; and
providing a stage device made by the method of claim 50.

52. A method of making a device utilizing the lithography system made by the method of claim 51.

53. A method of positioning a stage comprising inputting opposing forces for moving the stage in opposite directions at the substantially same location on the stage, such that a pulling force for moving the stage in a first direction is inputted at the same side of the stage as a pushing force for moving the stage in a second direction opposite to the first direction by varying a gap between portions of each electromagnetic actuator devices.

54. The method of claim 53, wherein said inputting comprises inputting magnetic driving forces with no physical contact of the stage by a driver.

55. The method of claim 53, further comprising controlling movements in at least three degrees of freedom of said stage by arranging three input locations on the stage, such that a pulling force for moving the stage in a first direction at each location is inputted at the same side of the stage as a pushing force for moving the stage in a second direction opposite to the first direction.

56. The method of claim 55, further comprising actuating said controlling movement in at least one degree of freedom with a vertical actuator.

57. The method of claim 56, wherein said controlling movement is actuated in three degrees of freedom.

58. The method of claim 56, wherein said vertical actuator comprises at least one voice coil motor.

59. The method of claim 53, further comprising floating said stage with respect to a support stage such that positioning movements of the stage are performed with no physical contact occurring between the stage and the support stage.

60. The method of claim 59, wherein said floating comprises electromagnetically biasing the stage with respect to the support stage.

61. The method of claim 55, further comprising supporting a weight of the stage by a supplemental vertical force at the substantially same location as said vertical actuator.

62. The method of claim 61, wherein the supplemental vertical force is generated by air bellows, and the vertical actuator is a pair of electromagnetic actuator devices disposed adjacent each other, each electromagnetic actuator device comprising an actuating portion and a relative moving portion that is movable relative to said actuating portion in a vertical direction.

63. The method of claim 53, wherein said pulling force is greater than said pushing force, resulting in a net force in said first direction.

64. The method of claim 53, wherein said pushing force is greater than said pulling force, resulting in a net force in said second direction.

65. An exposure method for forming a pattern on an object utilizing an optical system, the method comprising:
mounting said object on a stage;
moving a supporting stage substantially aligned with said optical system; and
moving said stage relative to said supporting stage by at least one pair of electromagnetic actuator devices coupling said stage to said supporting stage for control in at least one degree of freedom, both actuating portions of said pair of said electromagnetic actuator devices being mounted adjacent a single side of said stage,
wherein each electromagnetic actuator device is configured to vary a gap between portions of each electromagnetic actuator device.

66. The method of claim 65, wherein said actuating portion of said electromagnetic actuator device is mounted on said supporting stage, and a relative moving portion of said electromagnetic actuator device is mounted on said stage adjacent to said actuating portion within a predetermined gap defined by said electromagnetic actuator device.

67. The method of claim 65, wherein said stage is positionally controllable in at least three degrees of freedom, and said at least one pair of electromagnetic actuator devices comprises at least three pairs of electromagnetic actuator devices.

68. The method of claim 65, wherein said electromagnetic actuator device comprises a variable reluctance actuator.

69. The method of claim 65, wherein said at least one pair of electromagnetic actuator devices comprises three pairs of electromagnetic actuator devices that interconnect said stage and said supporting stage and are actuable to control said stage in three degrees of freedom.

70. The method of claim 65, further comprising levitating said stage above said supporting stage with at least one non-contact vertical support member.

71. The method of claim 70, further comprising supporting a weight of the stage by a supplemental vertical force at the substantially same location as said non-contact vertical support member.

72. The method of claim 65, further comprising:
moving said supporting stage with a drive device, said drive device comprises a first portion connected to said supporting stage and a second portion that is movable relative to said first portion, said second portion being supported by a supporting member; and
guiding said supporting stage in at least one direction with a base member.

73. A method for making a device utilizing the exposure method of any of claims 65 to 72.

74. A stage device comprising:
a stage that has a holding portion where an object can be held, said stage being controllable in at least one degree of freedom;
a first electromagnetic actuator device connected with said stage, said first electromagnetic actuator device moves said stage in one direction; and a second electromagnetic actuator device connected with said stage, said second electromagnetic actuator device moves said stage in an opposite direction of said one direction, wherein said holding portion of said stage is not disposed between a first transferring portion where a first force from an actuation of said first electromagnetic actuator device is transferred to said stage and a second transferring portion where a second force from an actuation of said second electromagnetic actuator device is transferred to said stage, wherein each of the first and second electromagnetic actuator devices is configured to vary a gap between portions of each of the first and second electromagnetic actuator devices.

75. The stage device of claim 74, wherein said first and second electromagnetic actuator device comprise variable reluctance actuators.

76. The stage device of claim 74, further comprising a stage support, and said first and second electromagnetic actuator devices couple said stage to said stage support.

77. The stage device of claim 76, wherein said first and second electromagnetic actuator device each comprising an actuating portion and a relative moving portion that is movable relative to said actuating portion, and one of said actuating portion and said relative moving portion is mounted on said stage and the other of said actuating portion and said relative moving portion is mounted on said stage support.

78. An exposure apparatus comprising:
an illumination system that irradiates radiant energy; and
the stage device according to any of claims 74 to 77.

79. A device on which an image has been formed by the exposure apparatus of claim 78.

80. A method of making a stage device comprising:
providing a stage that has a holding portion where an object can be held, said stage being controllable in at least one degree of freedom;
providing a first electromagnetic actuator device connected with said stage, said first electromagnetic actuator device moves said stage in one direction;
providing a second electromagnetic actuator device connected with said stage, said second electromagnetic actuator device moves said stage in an opposite direction of said one direction, and
varying a gap between portions of each of the first and second electromagnetic actuator devices,
wherein said holding portion of said stage is not disposed between a first transferring portion where a first force from an actuation of said first electromagnetic actuator device is transferred to said stage and a second transferring portion where a second force from an actuation of said second electromagnetic actuator device is transferred to said stage.

81. A method of making an exposure apparatus comprising:
providing an illumination system that irradiates radiant energy; and
providing a stage device made by the method of claim 80.

82. A method of making a device utilizing the exposure apparatus made by method of claim 81.

83. A method for driving a stage that has a holding portion where an object can be held, said stage being controllable in at least one degree of freedom, comprising:
moving said stage in one direction by transferring a first force from an actuation of a first electromagnetic actuator device; and
moving said stage in an opposite direction of said one direction by transferring a second force from an actuation of second electromagnetic actuator device,
wherein said holding portion of said stage is not disposed between a first transferring portion where said first force is transferred to said stage and a second transferring portion where said second force is transferred to said stage,
wherein each of the first and second electromagnetic actuator devices is configured to vary a gap between portions of each of the first and second electromagnetic actuator devices.

84. An exposure method for forming a pattern on an object utilizing the method for driving a stage of claim 83.

85. An method for making a device utilizing the exposure method of claim 84.

86. A stage device comprising:
a stage controllable in a vertical direction;
a supporting stage;
at least one electromagnetic actuator device mounted between said stage and said supporting stage for control in the vertical direction; and
at least one supplemental vertical support mounted between said stage and said supporting stage, and disposed at the substantially same location relative to the stage as said electromagnetic actuator device,
wherein the at least one electromagnetic actuator device is configured to vary a gap between portions of the at least one electromagnetic actuator device.

87. The stage device of claim 86, wherein said at least one electromagnetic actuator device comprises at least one pair of electromagnetic actuator devices disposed adjacent each other, each electromagnetic actuator device comprising an actuating portion and a relative moving portion that is movable relative to said actuating portion in the vertical direction, and one of said actuating portion and said relative moving portion is mounted on said stage and the other of said actuating portion and said relative moving portion is mounted on said supporting stage.

88. The stage device of claim 87, wherein both of said actuating portions of said pair of electromagnetic actuator devices are mounted on said supporting stage, and both of said relative moving portions are mounted on said stage and within a predetermined gap defined by said electromagnetic actuator devices.

89. The stage device of claim 87, wherein one relative moving portion is used as both of said relative moving portions of said pair of electromagnetic actuator devices.

90. The stage device of claim 87, wherein said electromagnetic actuator device comprises a variable reluctance actuator.

91. The stage device of claim 86, wherein at least one of said supplemental vertical supports comprises air bellows.

92. The stage device of claim 86, wherein said stage is positionally controllable in three vertical degrees of freedom, said at least one electromagnetic actuator device comprising at least three electromagnetic actuator devices and said at least one supplemental vertical support comprising at least three supplemental vertical supports, each of said at least three supplemental vertical supports being disposed at the substantially same location relative to the stage as a corresponding electromagnetic actuator device of said at least three electromagnetic actuator devices.

93. A stage device comprising:
a stage controllable in a vertical direction;
a supporting stage;

at least one electromagnetic actuator device mounted between said stage and said supporting stage for control in the vertical direction;

a plurality of supplemental vertical supports, for each of said electromagnetic actuator devices, mounted between said stage and said supporting stage, and disposed at the substantially same location relative to the stage as said each of the electromagnetic devices; and a suspending member that is supported by said plurality of supplemental vertical supports and flexibly suspends the stage, wherein the at least one electromagnetic actuator device is configured to vary a gap between portions of the at least one electromagnetic actuator device.

94. The stage device of claim 93, wherein said at least one electromagnetic actuator device comprises at least one pair of electromagnetic actuator devices disposed adjacent each other, each electromagnetic actuator device comprising an actuating portion and a relative moving portion that is movable relative to said actuating portion in the vertical direction, and both of said actuating portions of said pair of electromagnetic actuator devices are mounted on said supporting stage, and both of said relative moving portions are mounted on said stage and within a predetermined gap defined by said electromagnetic actuator devices.

95. The stage device of claim 94, further comprises a flexible member that connects the suspending member and at least one of the relative moving portions of said pair of electromagnetic actuator devices.

96. The stage device of claim 95, wherein the flexible member connects the suspending member and the at least one of the relative moving portions of said pair of electromagnetic actuator devices through a hole formed vertically within the actuating portion positioned above said at least one of the relative moving portions.

97. The stage device of claim 95, wherein the flexible member is a wire or a thin flexible rod.

98. The stage device of claim 95, wherein one relative moving portion is used as both of said relative moving portions of said pair of electromagnetic actuator devices, said two actuating portions are vertically aligned with said one relative moving portion interposed between the two actuating portions.

99. The stage device of claim 93, wherein said electromagnetic actuator device comprises a variable reluctance actuator.

100. The stage device of claim 93, wherein at least one of said supplemental vertical supports comprises air bellows.

101. The stage device of claim 93, wherein said stage is positionally controllable in three vertical degrees of freedom, said at least one electromagnetic actuator device comprising at least three electromagnetic actuator devices, said plurality of supplemental vertical supports being provided for each of said at least three electromagnetic actuator devices and being disposed at the substantially same location relative to the stage as a corresponding electromagnetic actuator device of said at least three electromagnetic actuator devices.

102. A method of positioning a stage comprising:

floating the stage for control in a vertical direction with no physical contact to the stage using an electromagnetic force generated at a location underneath the stage by varying a gap between portions of an electromagnetic actuator device; and supporting a weight of the stage by a supplemental vertical force at the substantially same location as the electromagnetic force.

103. The method of positioning a stage of claim 102, wherein the electromagnetic force is a sum of two forces in opposite directions generated by a pair of electromagnetic actuator devices disposed adjacent each other at the location underneath the stage.

104. The method of positioning a stage of claim 102, wherein the electromagnetic force is generated by a variable reluctance actuator.

105. The method of positioning a stage of claim 102, wherein the supplemental vertical force is generated by air bellows.

106. The method of positioning a stage of claim 102, further comprising controlling movements of the stage in three vertical degrees of freedom, by applying at least three electromagnetic forces at at least three locations underneath the stage and corresponding supplemental vertical forces for each of the electromagnetic forces.

107. A method of positioning a stage comprising:

floating the stage for control in a vertical direction with no physical contact to the stage using an electromagnetic force generated at a location underneath the stage by varying a gap between portions of the electromagnetic actuator device;

supporting a suspending member using a supplemental vertical force generated at the substantially same location as the electromagnetic force; and suspending the stage flexibly from the suspending member.

108. The method of positioning a stage of claim 107, wherein the electromagnetic force is a sum of two forces in opposite directions generated by a pair of electromagnetic actuator devices disposed adjacent each other at the location underneath the stage.

109. The method of positioning a stage of claim 108, further comprising suspending the stage using a flexible member that connects the suspending member and a relative moving portion of the electromagnetic actuator device mounted on the stage, said flexible member extending through a hole formed vertically within an actuating portion of the electromagnetic actuator device positioned above the relative moving portion.

110. The method of positioning a stage of claim 109, wherein the flexible member is a wire or a thin flexible rod.

111. The method of positioning a stage of claim 107, wherein the electromagnetic force is generated by a variable reluctance actuator.

112. The method of positioning a stage of claim 107, wherein the supplemental vertical force is generated by air bellows.

113. The method of positioning a stage of claim 107, further comprising controlling movements of the stage in three vertical degrees of freedom, by applying at least three electromagnetic forces at at least three locations underneath the stage and by suspending the stage from corresponding suspending members for each of the electromagnetic forces.

114. An exposure apparatus comprising:

an illumination system that irradiates radiant energy; and the stage device according to any of claims 86 to 101.

115. An exposure method for forming a pattern on an object utilizing method of positioning a stage according to any claims 102 to 113.

116. A stage device comprising:

a stage controllable in a vertical direction;

an electromagnetic target rigidly connected to the stage;

an electromagnet electromagnetically coupling with the stage for control in the vertical direction without physical contact to the electromagnetic target by varying a gap between the electromagnet and the electromagnetic target; and a supplemental vertical support for supporting a weight of the stage, wherein a force generated by the supplemental vertical support acts on the electromagnetic target for supporting the weight of the stage.

* * * * *

UNITED STATES PATENT AND TRADEMARK OFFICE
CERTIFICATE OF CORRECTION

PATENT NO. : 6,750,625 B2 Page 1 of 1
DATED : June 15, 2004
INVENTOR(S) : Binnard et al.

It is certified that error appears in the above-identified patent and that said Letters Patent is hereby corrected as shown below:

Column 15,
Line 20, "end" should read -- and --.

Column 17,
Line 64, "member." should read -- members. --.

Column 19,
Line 23, "portion" should read -- portions --.

Column 22,
Line 3, "of second" should read -- of a second --.
Line 15 "An method" should read -- A method --.

Column 24,
Line 61, "utilizing method" should read -- utilizing the method --.
Line 62, "any claims" should read -- any of claims --.

Signed and Sealed this

Seventh Day of December, 2004

JON W. DUDAS
*Director of the United States Patent and Trademark Office*